(12) United States Patent
Fujimaki

(10) Patent No.: US 7,026,221 B2
(45) Date of Patent: Apr. 11, 2006

(54) METHOD OF FORMING SEMICONDUCTOR DEVICE WITH BIPOLAR TRANSISTOR HAVING LATERAL STRUCTURE

(75) Inventor: Hirokazu Fujimaki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/352,873

(22) Filed: Jan. 29, 2003

(65) Prior Publication Data
US 2003/0203582 A1     Oct. 30, 2003

(30) Foreign Application Priority Data
Apr. 26, 2002   (JP) .............................. 2002-127217

(51) Int. Cl.
*H01L 21/8228*   (2006.01)
*H01L 21/331*    (2006.01)

(52) U.S. Cl. ....................... 438/325; 438/335
(58) Field of Classification Search ........ 438/197–203, 438/226, 233, 235, 249, 251, 309, 337, 340, 438/350, 357, 358, 142, 336, FOR. 165, 438/FOR. 166, 204, 236, 322, 325, 331, 438/348, 352, 361, 365, 369, 378, 189; 257/499, 257/556, 557, 565, 574, 575, E27.074
See application file for complete search history.

(56) References Cited

U.S. PATENT DOCUMENTS

| | | | | |
|---|---|---|---|---|
| 5,073,812 A | * | 12/1991 | Shimura | 257/587 |
| 5,476,799 A | * | 12/1995 | Sakamoto et al. | 438/530 |
| 5,686,323 A | * | 11/1997 | Kataoka | 438/369 |
| 5,710,442 A | * | 1/1998 | Watanabe et al. | 257/107 |

FOREIGN PATENT DOCUMENTS

| | | |
|---|---|---|
| JP | 63-140571 | 6/1988 |
| JP | 11233521 | 8/1999 |
| JP | 2000-188295 | 7/2000 |

* cited by examiner

*Primary Examiner*—Brook Kebede
(74) *Attorney, Agent, or Firm*—Volentine Francos & Whitt, PLLC

(57) ABSTRACT

A method of forming a semiconductor device, including forming first and second semiconductor layers of first conductivity type each disposed in a transistor forming region spaced apart from each other by a predetermined distance, so that the first semiconductor layer has a concentration higher than the second semiconductor layer; vapor-phase diffusing an impurity of second conductivity type into side faces of the second semiconductor layer which are exposed in the spaced region; embedding a non-doped semiconductor layer between the first and second semiconductor layers in the spaced region; and performing heat treatment to change the non-doped semiconductor layer into first conductivity type, a region of the vapor phase diffused side faces into the first conductivity type, and another region of the vapor phase diffused side faces into an intrinsic base region.

17 Claims, 16 Drawing Sheets

FIG. 1-a
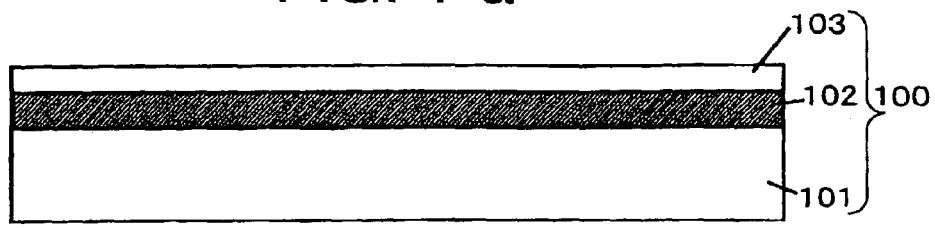
FIG. 1-b
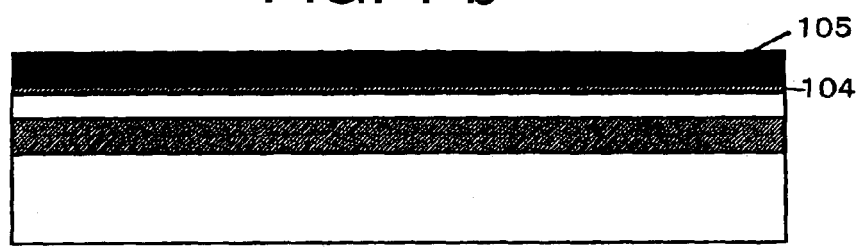
FIG. 1-c
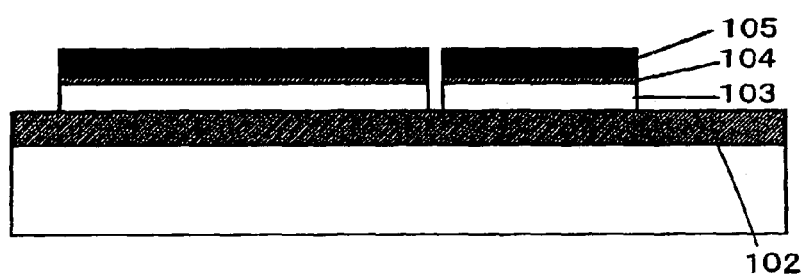
FIG. 1-c2
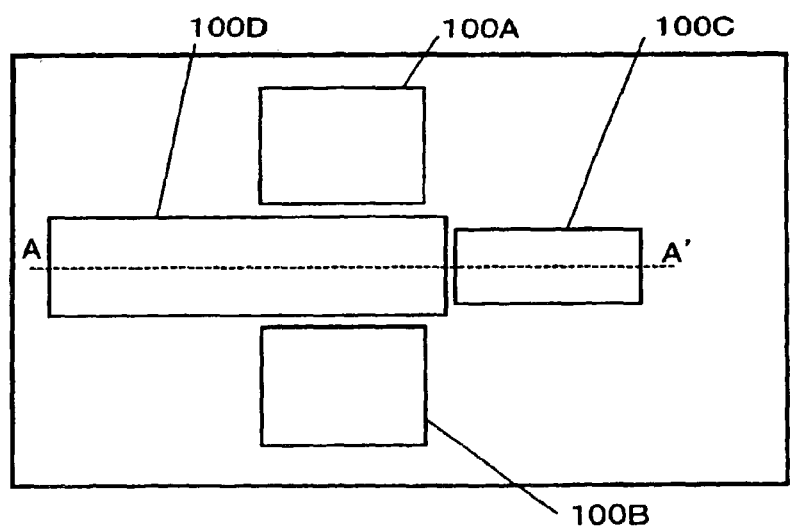

FIG. 1-d
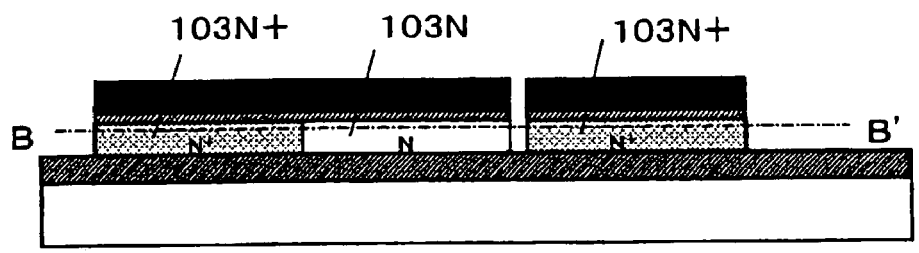
FIG. 1-d2
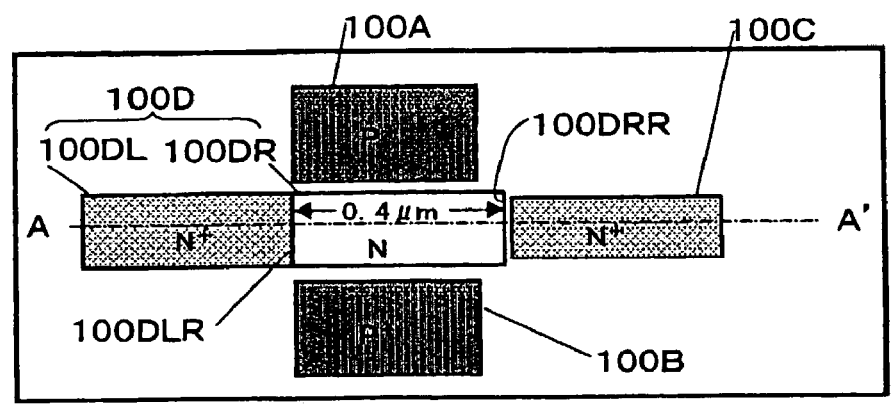
FIG. 1-e
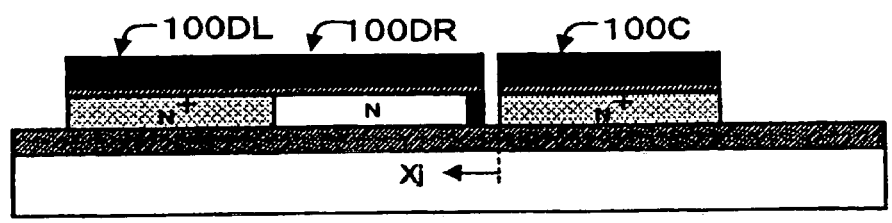

FIG. 1-f
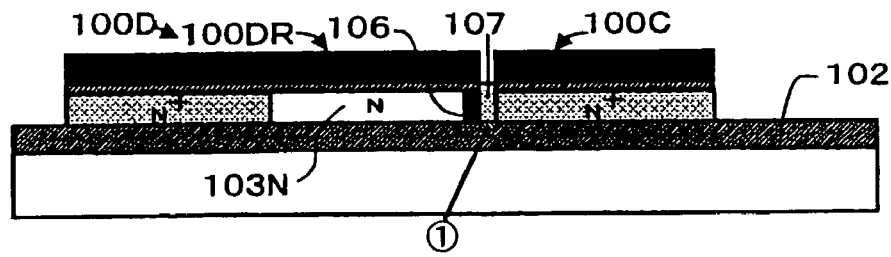
FIG. 1-g
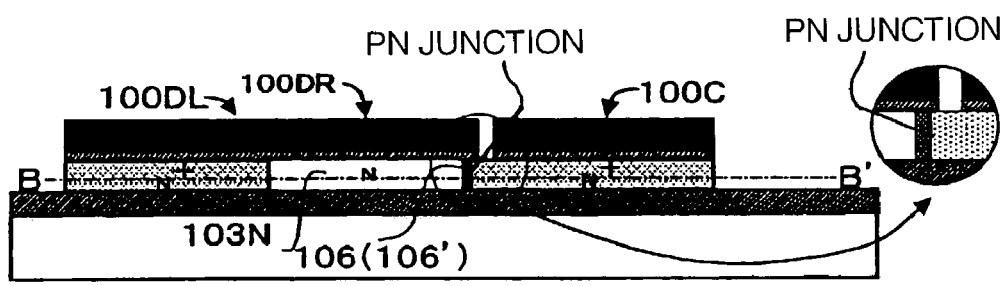
FIG. 1-g2
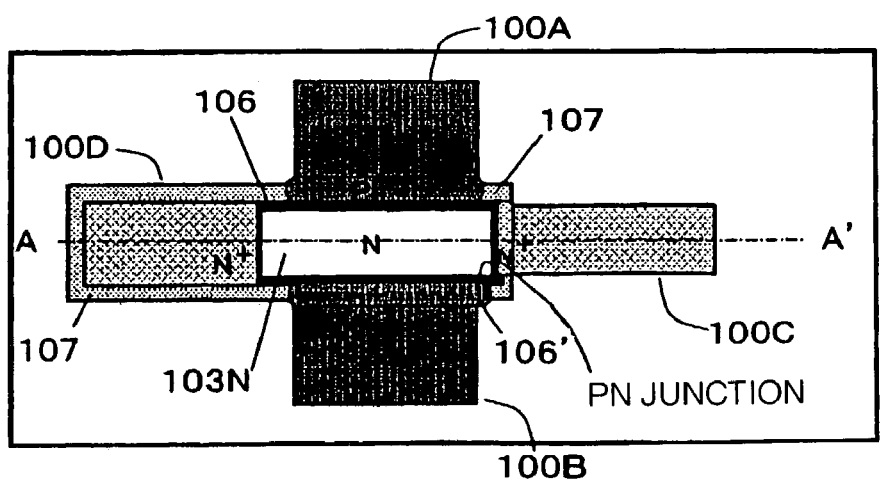

Fig. 2-a
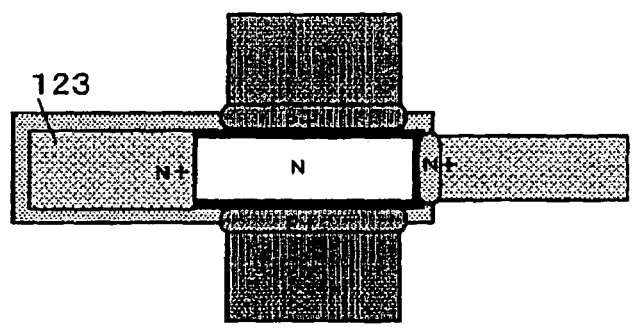
Fig. 2-b
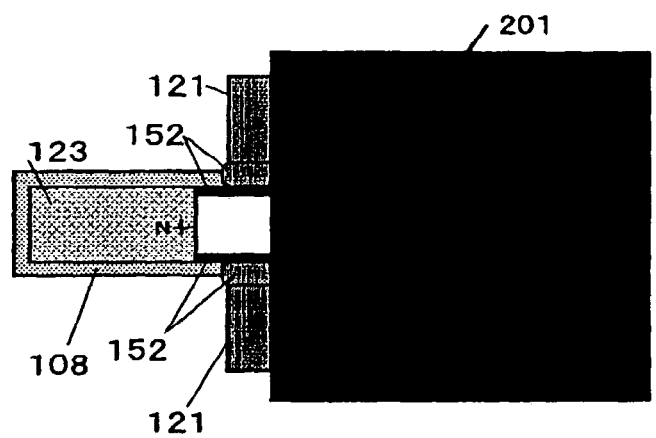
Fig. 2-c
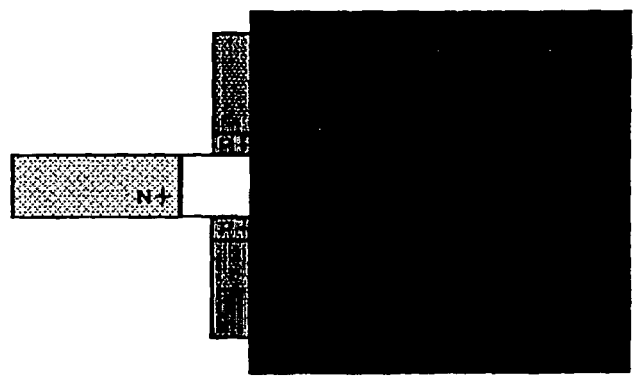

FIG. 3-a
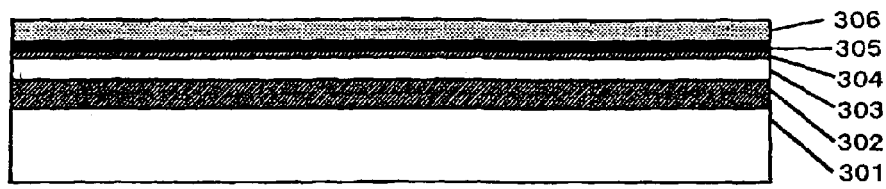
FIG. 3-b
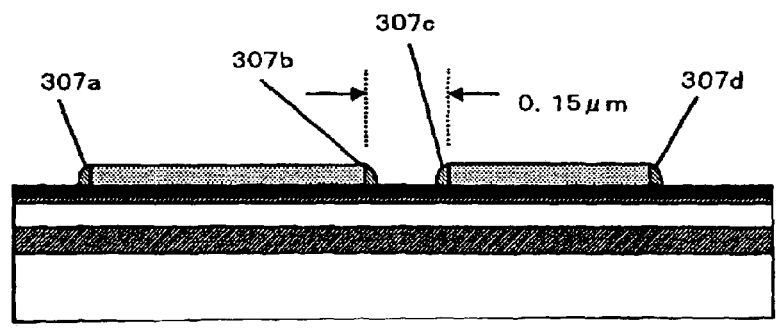
FIG. 3-c
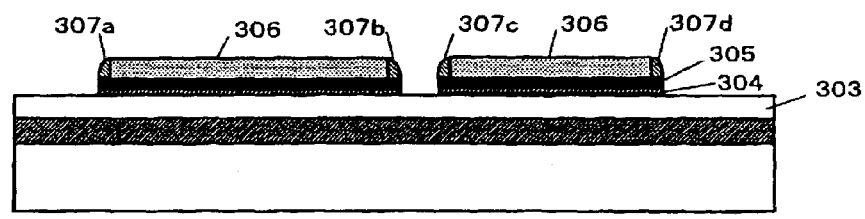
FIG. 3-d
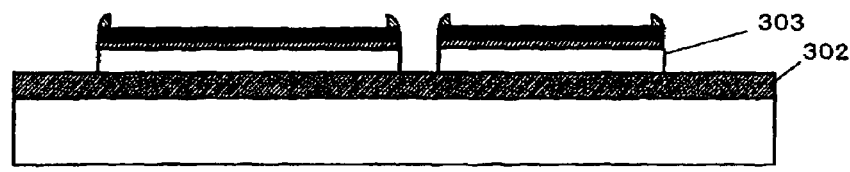
FIG. 3-e
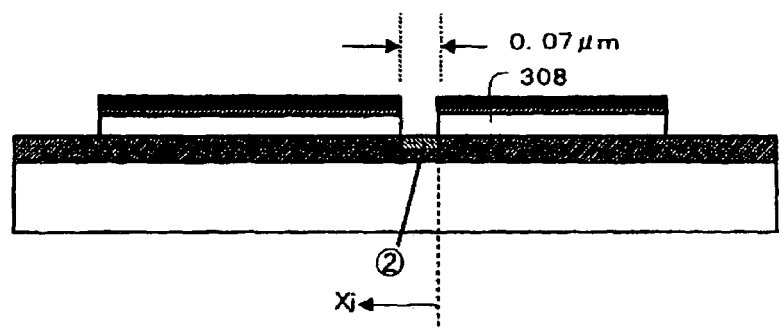

FIG. 4-a
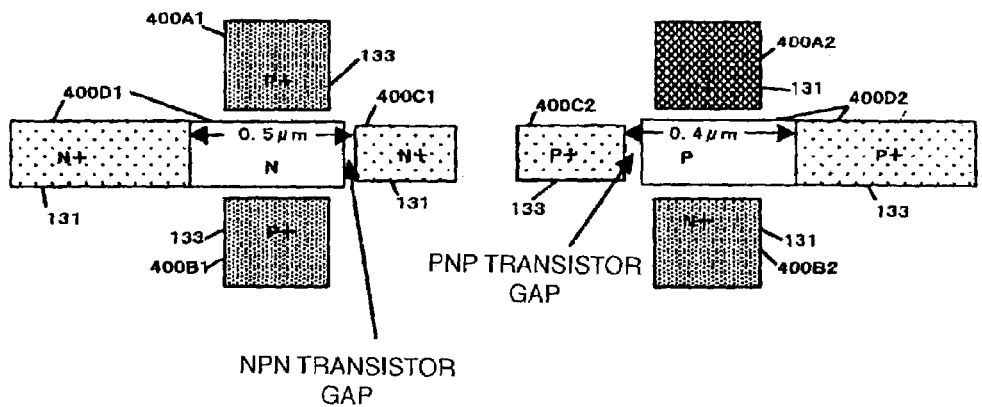
FIG. 4-b
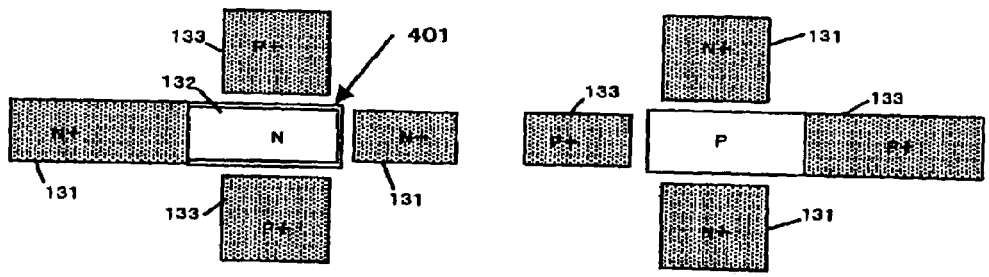
BLOCK GAS DOPING OF PNP TRANSISTOR BY THIN THERMAL OXIDE FILM
FIG. 4-c
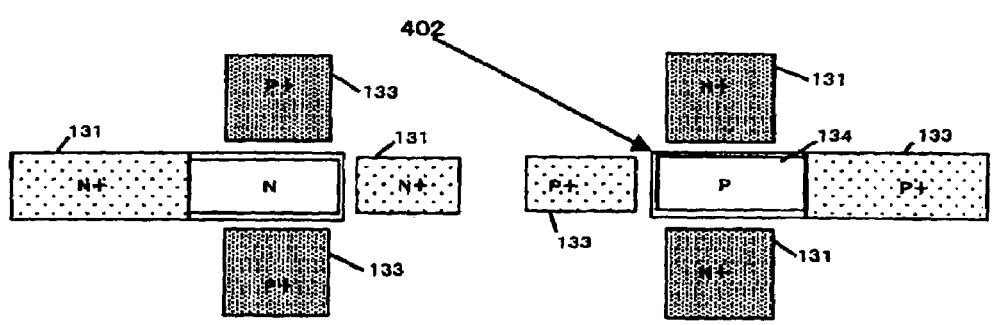
BLOCK GAS DOPING OF NPN TRANSISTOR BY THIN THERAL OXIDE FILM

FIG. 5-a
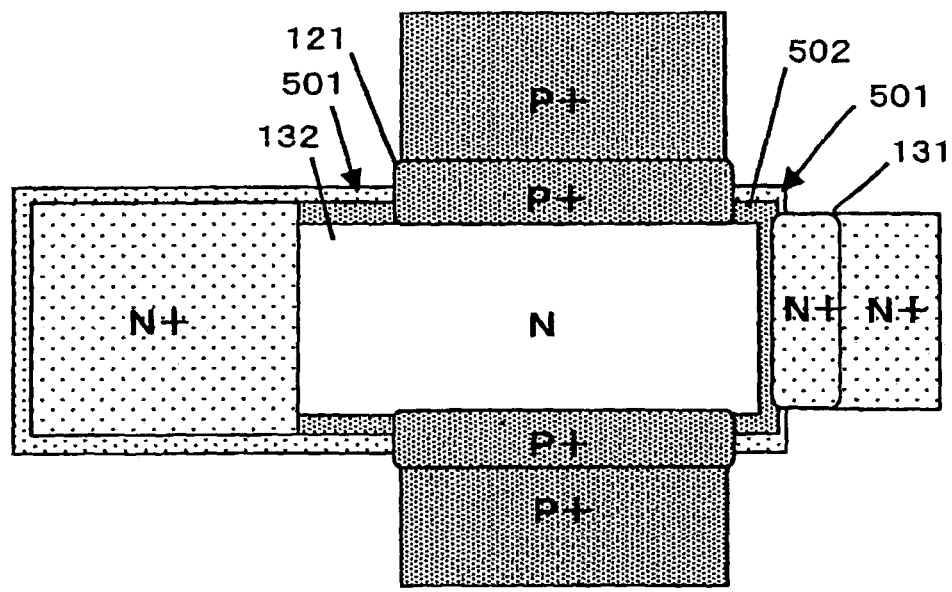
FIG. 5-b
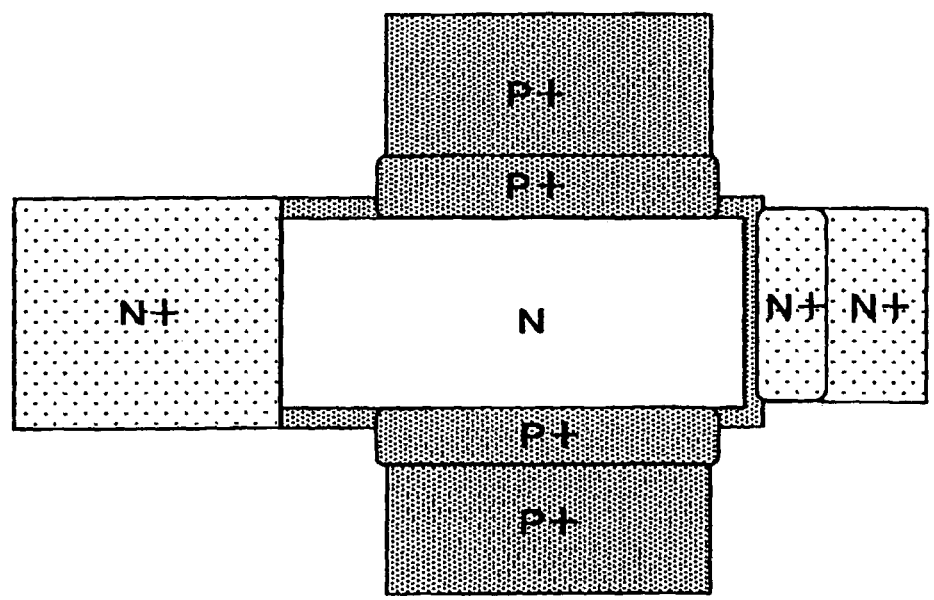

FIG. 6-a
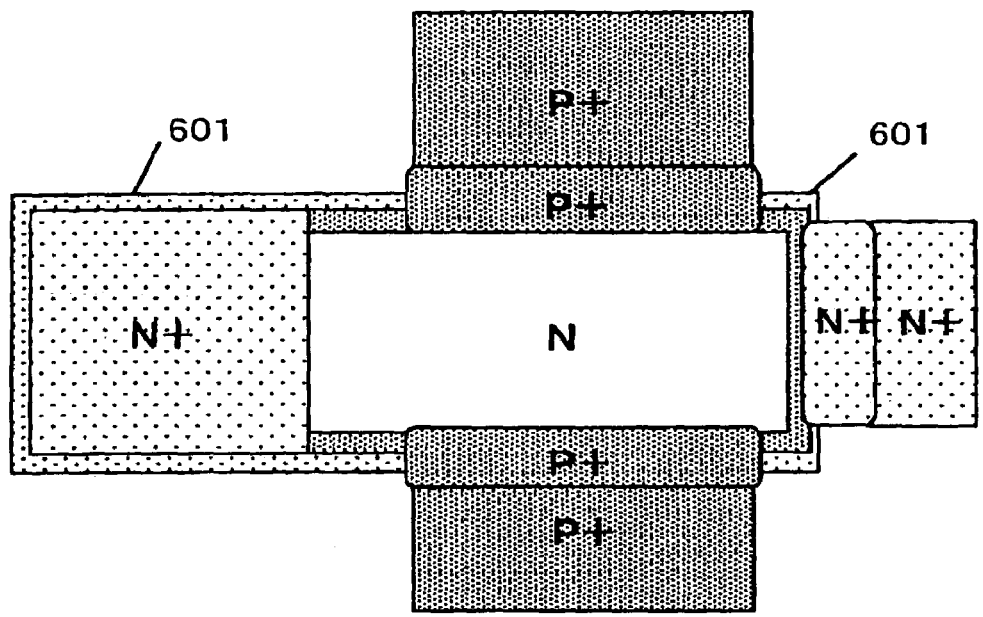
FIG. 6-b
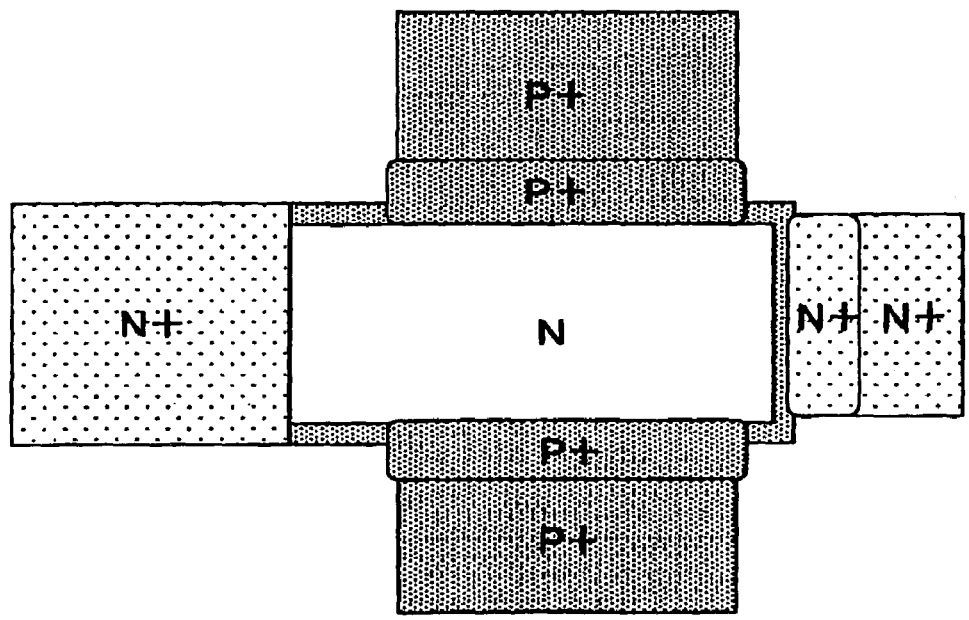

FIG. 7-a
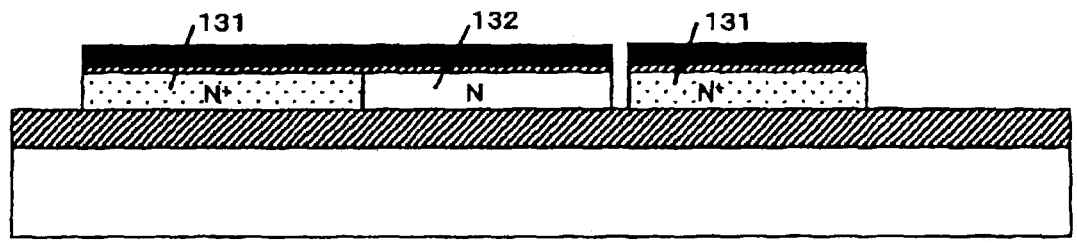
FIG. 7-b
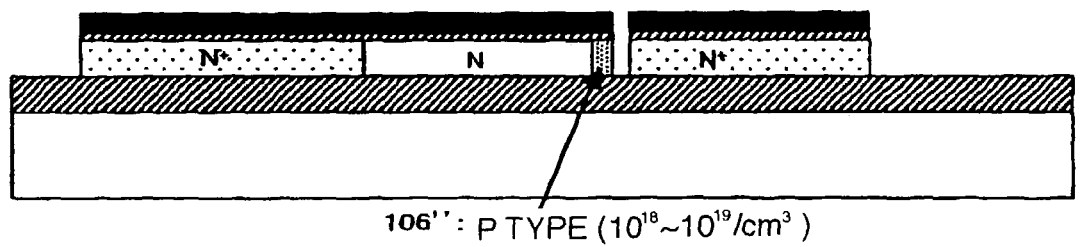
$106''$: P TYPE ($10^{18} \sim 10^{19}/cm^3$)
FIG. 7-c
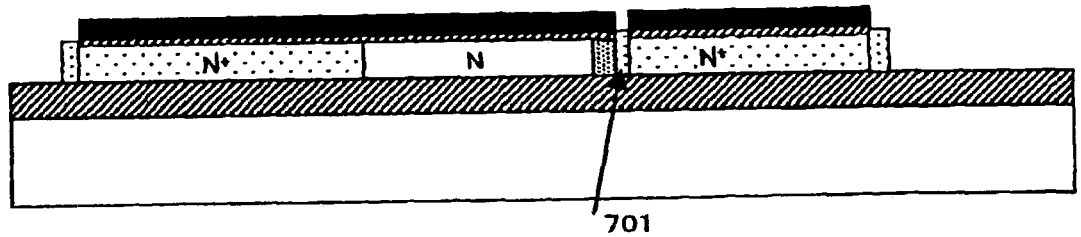
NON-DOPED Si-C SELECTIVE EPITAXIAL GROWTH LAYER

FIG. 8-a
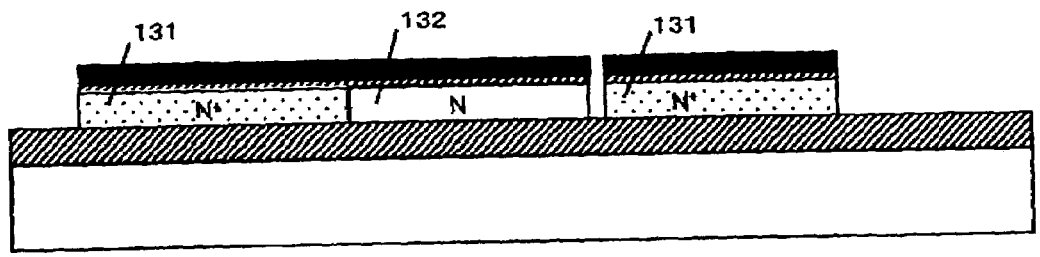
FIG. 8-b
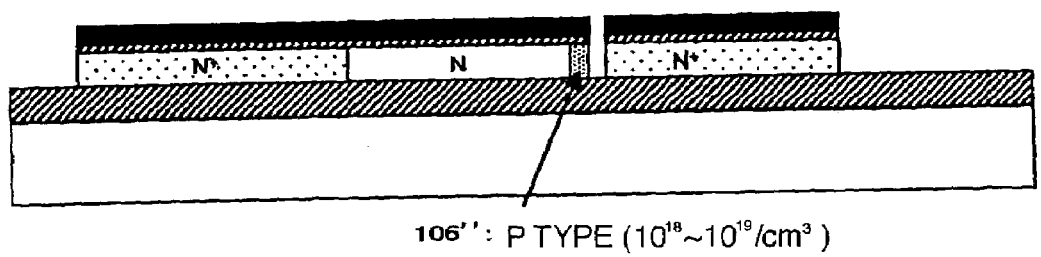
$106''$: P TYPE ($10^{18} \sim 10^{19}/cm^3$)
FIG. 8-c
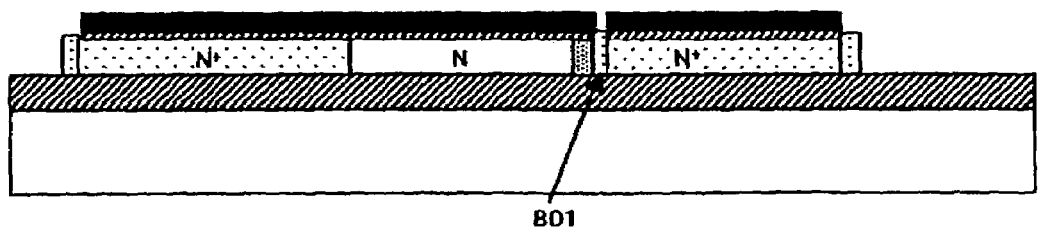
NON-DOPED SiGe:C SELECTIVE EPITAXIAL GROWTH LAYER

FIG. 9-a
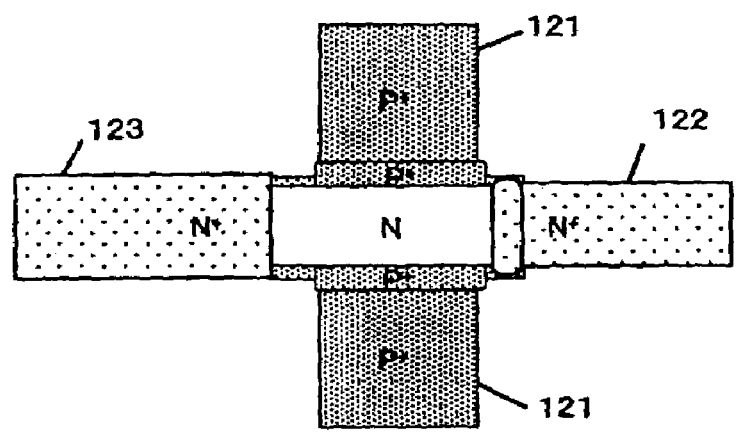
FIG. 9-b
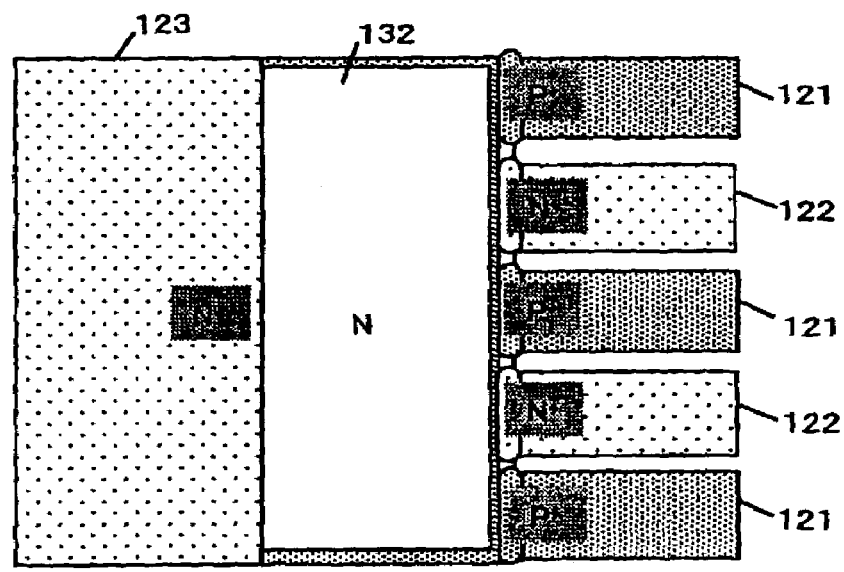

Fig. 10-a
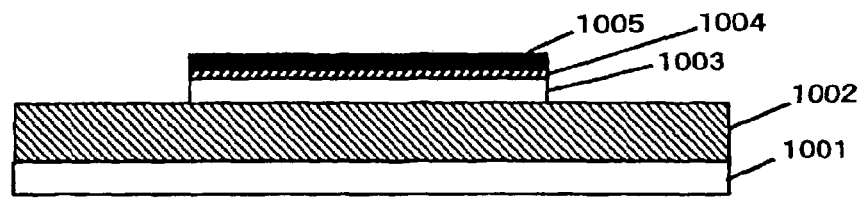
Fig. 10-b
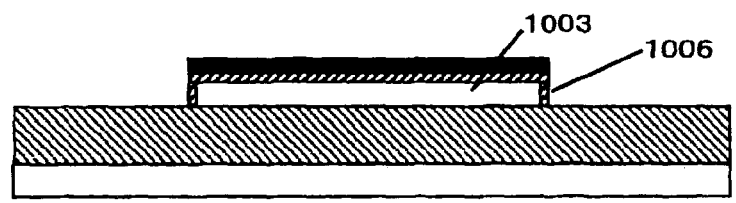
Fig. 10-c
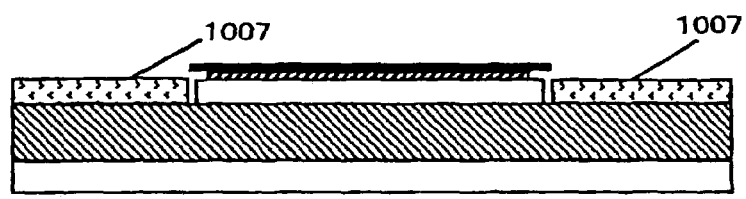
Fig. 10-d
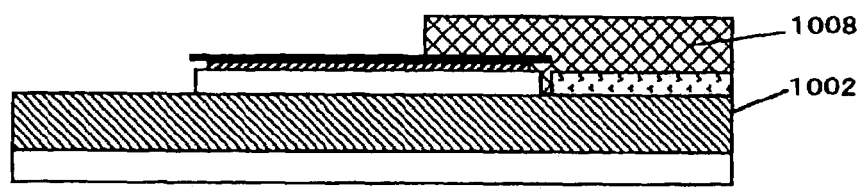

Fig. 10-d2
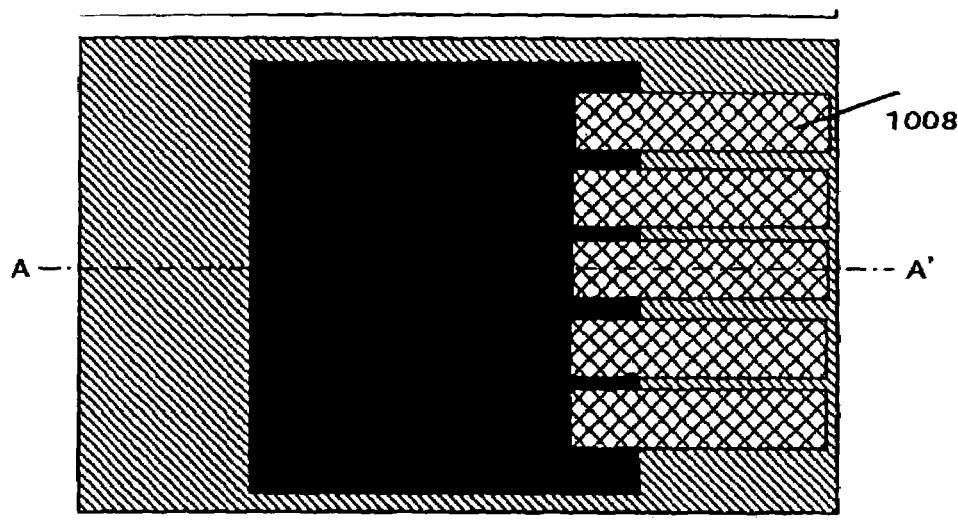
Fig. 10-e
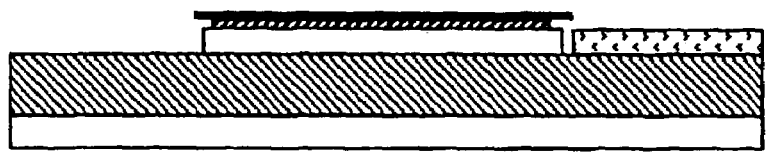
Fig. 10-f
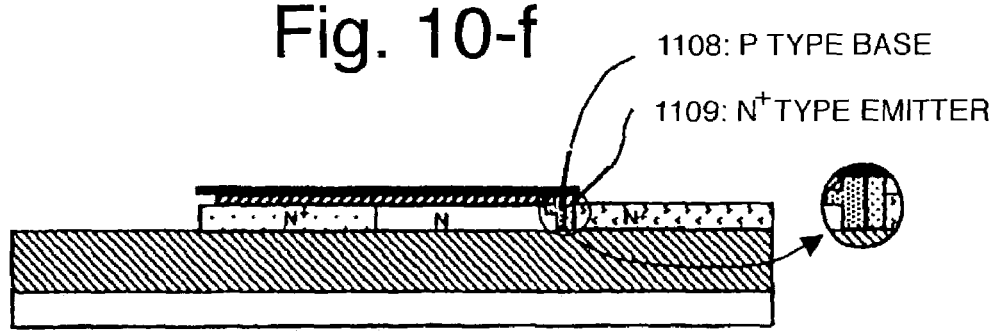
1108: P TYPE BASE
1109: N$^+$ TYPE EMITTER

FIG. 11-a
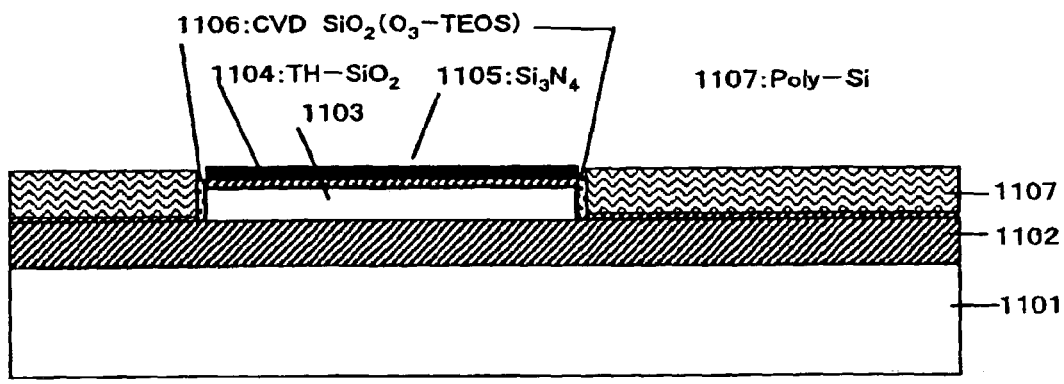
FIG. 11-b
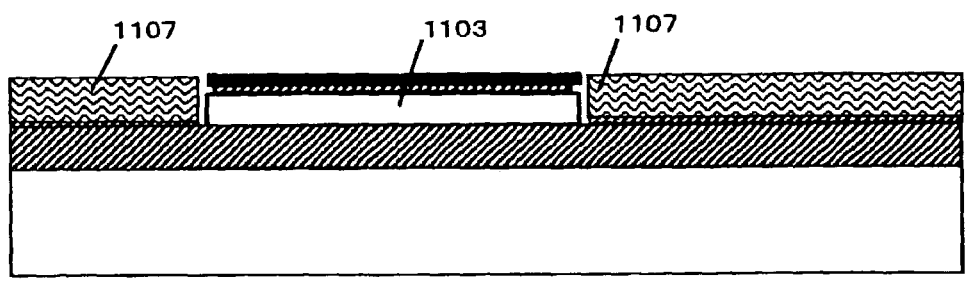
FIG. 11-c
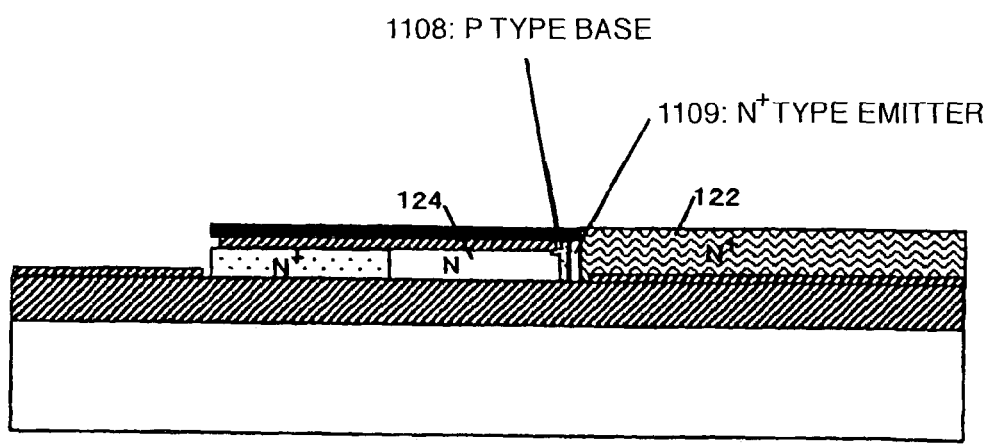

METHOD OF FORMING SEMICONDUCTOR DEVICE WITH BIPOLAR TRANSISTOR HAVING LATERAL STRUCTURE

BACKGROUND OF THE INVENTION

1. Field of the Invention

The present invention relates to a method of forming a semiconductor device, and particularly to a method of forming a semiconductor device with a bipolar transistor having a lateral structure.

2. Description of the Related Art

One point of the superiority of a bipolar LSI to CMOS-LSI, resides in high-speed performance of a transistor per se and high-speed performance that originates from the magnitude or level of current drive capacity. It has however been said that since power consumption is relatively high, the bipolar LSI has not been suited to high-scale high integration.

In terms of the power consumption, attention has been given to a CMOS structure. Thus, there have been proposed several circuit systems or modes in which even in a bipolar device, PNP and NPN transistors are used for its basic circuit on the pattern of the CMOS structure to thereby maintain or increase its high-speed performance and high drive capacity, thus making it possible to significantly reduce power consumption.

There is known a lateral bipolar transistor provided on an SOI (Silicon On Insulated) substrate 1403, which has been described in, for example, Japanese Patent Application Laid-Open No. Hei 5(1993)-21446. A sidewall insulating layer 21 is formed on each side face of a polycrystal silicon layer 70 used as a base drawing or withdrawal electrode 7 as shown in FIG. 13. A P type impurity is ion-implanted in a base-emitter opening with the base drawing electrode 7 and the sidewall insulating layer 21 as masks, whereby a P type base region 6B having a thickness substantially equal to the sidewall insulating layer 21 is formed.

However, the conventional lateral bipolar transistor is accompanied by a problem that a minimum processing width based on photolithography is restricted, and if implantation is made over a given depth even in the case of a process using a self-alignment reduction process for sidewalls or the like, then an implanted impurity collides with a substance to be implanted and is hence reflected, thus allowing it to spread over an implantation width, whereby an intrinsic base width is expanded due to lateral channeling.

Therefore, the base width cannot be narrowed. As a result, the time required for carries in a base high in rate contributing to the transistor high-speed performance to run will increase.

An object of the present invention is to provide a semiconductor device manufacturing method of narrowly forming a base width, and a semiconductor device manufactured by the same method.

SUMMARY OF THE INVENTION

The present invention adopts the following solving means to solve the foregoing problems.

The present invention provides a method of forming a semiconductor device, includes processes for forming first and second semiconductor layers of first conductivity type each disposed in a transistor forming region with both being spaced a predetermined distance from each other, and forming the first semiconductor layer so as to have a concentration higher than the second semiconductor layer; a step for vapor-phase diffusing an impurity of second conductivity type into side faces of the second semiconductor layer, which are exposed in the spaced region; a step for embedding a non-doped semiconductor layer between the first and second semiconductor layers in the spaced region; and a step for performing heat treatment until the non-doped semiconductor layer is brought to the first conductivity type, part of a region for the second conductivity type impurity diffused into sidewalls of the second semiconductor layer is brought to the first conductivity type, and the other region for the second conductivity type impurity is brought to an intrinsic base region.

Thus, the second conductivity type impurity is vapor-phase diffused into the side faces of the second semiconductor layer, which are exposed in the spaced region to thereby form a thin impurity layer on each side face. Further, the non-doped semiconductor layer is embedded between the thin impurity layer and the first semiconductor layer, so that it is formed so as to allow diffusion of the corresponding impurity. By carrying out thermal diffusion, the thin impurity layer is formed thinner.

The present invention is characterized by having a method of forming a thin impurity layer in this way and a semiconductor device having such a construction. They will be explained below specifically.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 1-*a* through 1-*c* are process diagrams showing a first embodiment of the present invention;

FIGS. 1-*d* through 1-*g2* are process diagrams showing the first embodiment of the present invention;

FIGS. 2-*a* through 2-*c* are process diagrams showing a second embodiment of the present invention;

FIGS. 3-*a* through 3-*e* are process diagrams illustrating a third embodiment of the present invention;

FIGS. 4-*a* through 4-*c* are process diagrams showing a fourth embodiment of the present invention;

FIGS. 5-*a* and 5-*b* are process diagrams depicting a fifth embodiment of the present invention;

FIGS. 6-*a* and 6-*b* are process diagrams showing a sixth embodiment of the present invention;

FIGS. 7-*a* through 7-*c* are process diagrams illustrating a seventh embodiment of the present invention;

FIGS. 8-*a* through 8-*c* are process diagrams showing an eighth embodiment of the present invention;

FIGS. 9-*a* and 9-*b* are process diagrams illustrating a ninth embodiment of the present invention;

FIGS. 10-*a* through 10-*f* are process diagrams depicting a tenth embodiment of the present invention;

FIGS. 11-*a* through 11-*c* are process diagrams showing an eleventh embodiment of the present invention;

DETAILED DESCRIPTION OF THE PREFERRED EMBODIMENTS

Figure 12:
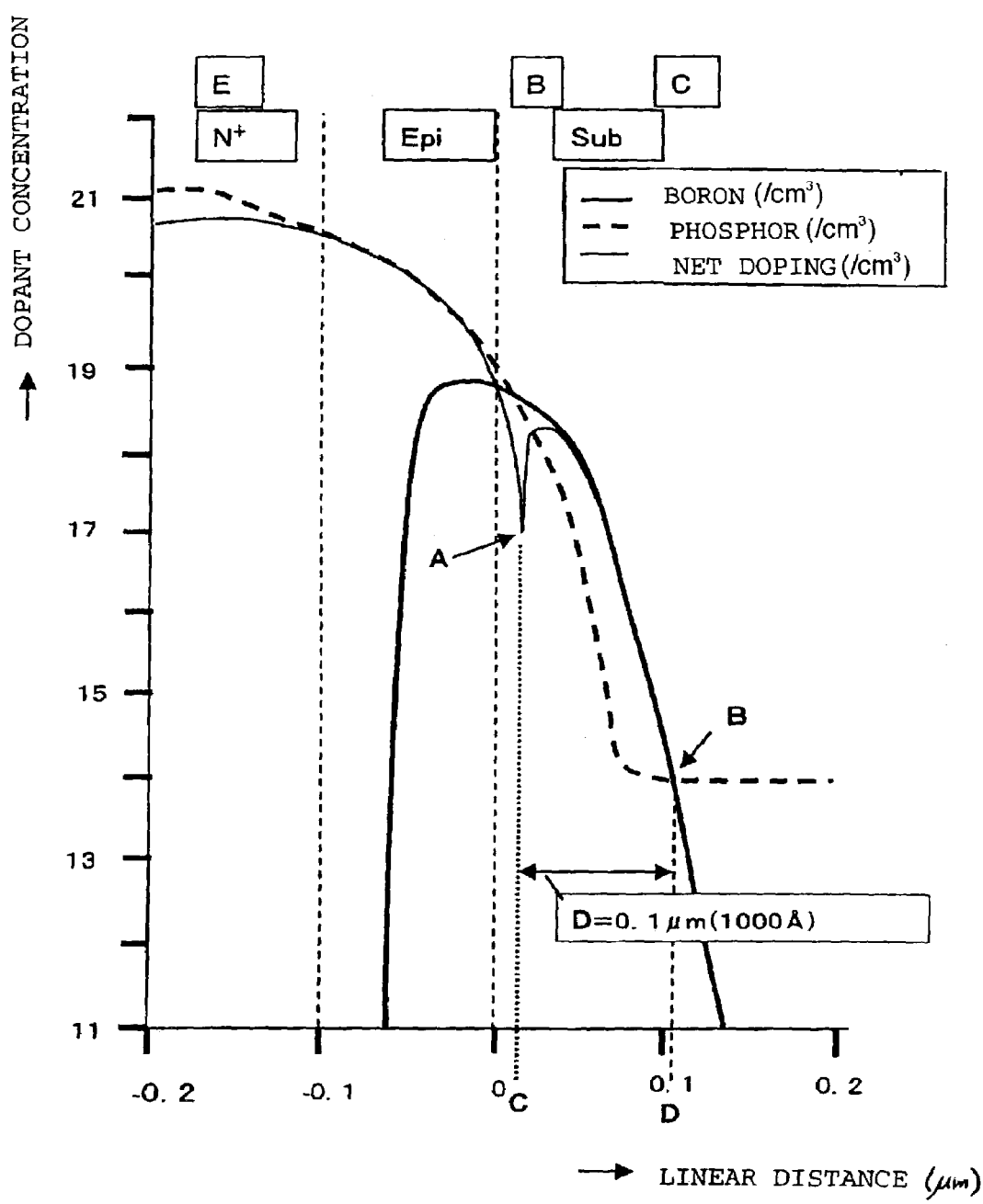
FIG. 12 is a diagram illustrating an impurity diffused state of a semiconductor device of the present invention.
Figure 13:
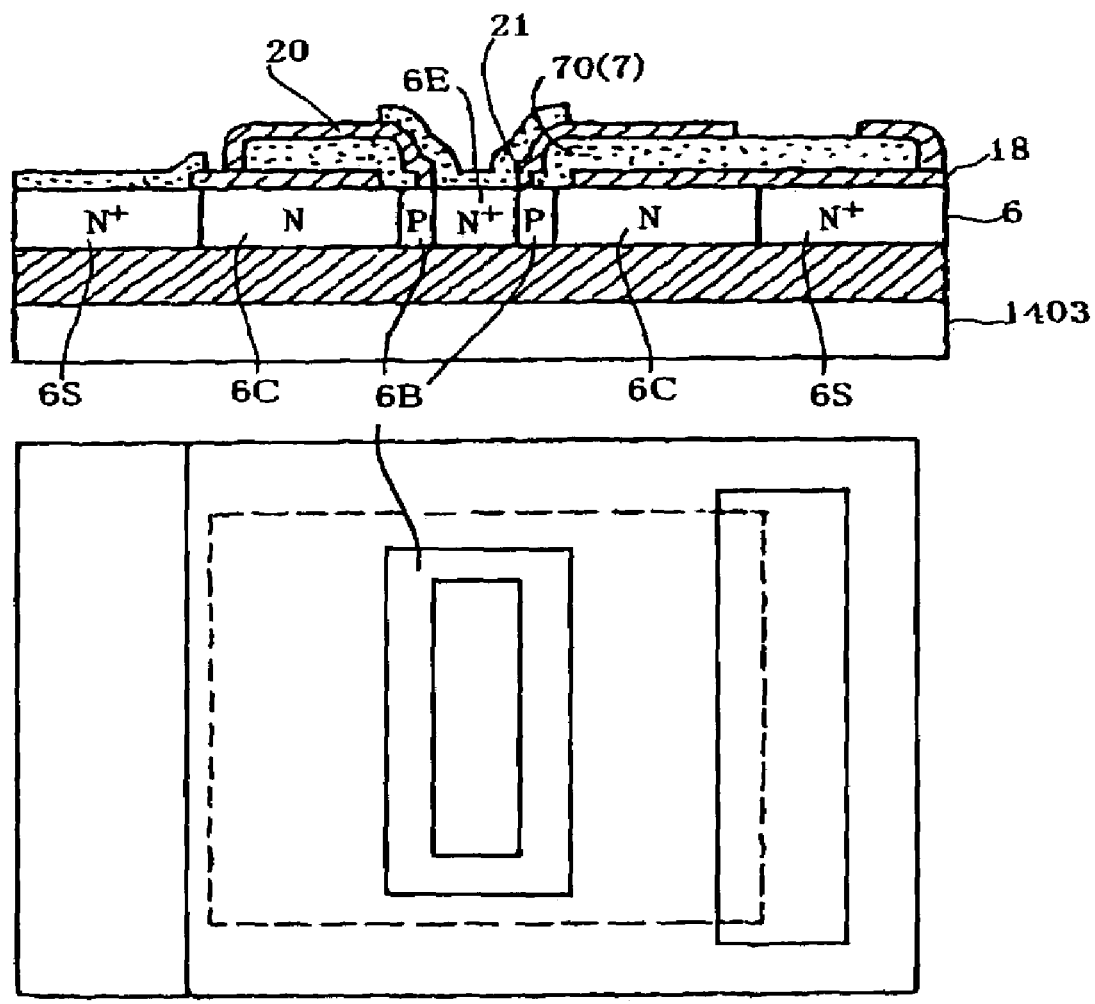
FIG. 13 is a configurational diagram showing a conventional example.

Preferred embodiments of the present invention will hereinafter be described in detail with reference to the accompanying drawings.

First Embodiment

A process diagram showing a first embodiment of the present invention is illustrated in FIGS. 1-a through 1-g2.

FIGS. 1-a, 1-b and 1-c are respectively cross-sectional views divided by line A–A' of FIG. 1-c2.

A wafer 100 makes use of an SOI wafer formed of SIMOX (Silicon Implanted Oxide).

The wafer 100 comprises a substrate wafer layer 101, a buried oxide film layer 102 and a silicon layer 103 in order from below.

The thickness of the buried oxide film layer 102 is about 200 nm and the thickness of the silicon layer 103 is 100 nm. Each of them is formed as a phosphor-doped N type silicon layer having a resistivity of 1Ω·cm (see FIG. 1-a).

First, the whole surface of the wafer 100 is subjected to thermal oxidation to form a thermal oxide film 104 having a thickness of about 5 nm. Next, a silicon nitride film 105 is produced on the thermal oxide film 104 with a thickness of about 100 nm by a CVD method (see FIG. 1-b).

Next, a resist (not shown) is applied on the silicon nitride film 105, and resist patterns (not shown) are formed according to a first exposure process step for patterning the resist (not shown) by photolithography. With the resist patterns as masks, the silicon nitride film 105, the thermal oxide film 104 and the silicon layer 103 are vertically etched by anisotropic etching to thereby expose the buried oxide film layer 102 (see FIG. 1-c).

At this time, masked non-etching regions are left as four island-shaped regions (100A, 100B, 100C and 100D) as shown in FIG. 1-c2 on a plane basis. These island-shaped regions are formed in positions where their intervals are rendered close to one another at equal intervals of about 100 nm (see FIG. 1-c2).

Next, the regions other than the island-shaped region 100A and the island-shaped region 100B are first masked by resist patterns (not shown) according to a second exposure process step, and boron $B^+$ is ion-implanted under a dose condition of 5E16 ions/cm$^3$ at 50 KeV.

FIG. 1-d is a cross-sectional view cut by line A–A' of FIG. 1-d2, and FIG. 1-d2 is a plan view cut by line B–B' of FIG. 1-d, respectively.

Each of the island-shaped regions 100A and 100B is brought to a $P^+$ region (see FIG. 1-d2) by ion-implantation of boron $B^+$.

Thereafter, the resist (not shown) is removed and resist patterns (not shown) provided with openings respectively associated with the island-shaped region 100C and a left island-shaped region 100DL of the island-shaped region 100D are formed according to a third exposure process step. The side of the opening corresponding to a side 100DLR of the left island-shaped region 100DL, of the resist pattern (not shown) is set to a position spaced 0.4 μm or more from a side 100DRR close to the island-shaped region 100C, of a right island-shaped region 100DR as viewed in a direction to separate from the island-shaped region 100C.

With resist patterns (not shown) as masks, phosphor $P^+$ is ion-implanted in the silicon layer 103 for the island-shaped region 100C and the left island-shaped region 100DL at 80 keV under about 5E16 ions/cm$^3$. Thus, each of the island-shaped regions 100C and 100DL is formed as an $N^+$ region. The right island-shaped region 100DR remains held at an N type.

After the removal of the resist patterns, furnace anneal (heat treatment is next done at 850° C. for 30 minutes in a nitrogen atmosphere, followed by execution of a RTA (Rapid Thermal Anneal) process at 950° C. for 10 seconds to thereby activate ion-implanted regions (respective island-shaped regions 100A, 100B, 100C and 100DL) (see FIGS. 1-d and 1-d2). At this time, a thin oxide film (not shown) is formed on the exposed side face of the silicon layer 103 for each of the island-shaped regions (100A, 100B, 100C and 100D), based on the furnace anneal and the RTA process.

FIGS. 1-e, 1-f and 1-g are respectively cross-sectional views each cut by line A–A' of FIG. 1-g2.

After the completion of the process steps up to FIG. 1-d (cross-section) and FIG. 1-d2 (plane), the extra-thin oxide film of about 2 nm, which is produced on each of the side faces of the respective island-shaped regions (100A, 100B, 100C and 100D) by the furnace anneal at 850° C. for 30 minutes and the RTA process at 950° C. for 10 seconds, is removed by diluted HF acid to thereby expose a monocrystal Si layer for the side face of each island-shaped region. Further, 5-minute heat treatment is done in a hydrogen atmosphere at 800° C., at a $B_2H_6$ concentration of 50 ppm and under a reduced pressure of 15 Torr, and a 10-minutes heat treatment is done in a hydrogen atmosphere not containing $B_2H_6$.

Thus, boron B is diffused into side walls of the monocrystal Si layers of the respective island-shaped regions (100A, 100B, 100C and 100D) (see FIG. 1-e).

A profile of boron B diffused from in this vapor-phase atmosphere to in Si is as follows. The uppermost surface layer is 5E19 atoms/cc, and the depth set until the concentration of boron B is reduced three digits is about 50 nm. Thus, the following phenomena occur.

① An N-type exposed Si surface layer of 100DR is reversed to a P type. The sidewall diffusion layer 106 reversed to the P type is shown in FIG. 1-e and FIG. 1-g2 indicating the previous process steps.

② $N^+$ type exposed Si surface layers of 100DL and 100C respectively remain held at an $N^+$ type.

③ $P^+$ type exposed Si surface layers of 100A and 100B (see FIG. 1-g2 indicative of the previous process steps) respectively remain held at a $P^+$ type.

According to the above-described fact, only the N type Si surface layer of 100DR can be reversed to the P type in the present process. The boron B profile at that portion results in the surface peak concentration of 5E19 atoms/cc as described above and is hence extremely rendered steep.

Next, Si is selectively epitaxially-grown at 800° C. and 15 Torr. At this time, a process condition is taken wherein a hydrogen gas is 20SLM, $SiCH_2Cl_2$=100 sccm and HCl=50 sccm. At this time, a growth rate is 20 nm/min.

Owing to the selective growth, Si is not grown on the silicon nitride film and the silicon oxide film. Under such a growth condition, an epitaxial layer of 60 nm is grown.

Thus, a gap or space defined between the island-shaped region 100D and the island-shaped region 100C is perfectly buried by monocrystal Si (107) as the sectional structure has been described in FIG. 1-f.

In particular, the monocrystal Si (107) is embedded in the exposed surface of the side-wall diffusion layer 106 formed by diffusing the P type boron B into the N type exposed Si surface layer of the region 100DR while contacting the exposed surface thereof. Incidentally, the same monocrystal Si is embedded even into a clearance or space defined between each of the island-shaped region 100A and island-shaped region 100B (refer to FIG. 1-g2 indicative of the previous process steps) and the island-shaped region 100D in a manner similar to the above, whereby the four island-shaped regions (100A, 100B and 100C and 100D) are perfectly coupled to one another. A crystal defect occurs in a portion (① in FIG. 1-f), which makes a boundary to the buried oxide film 102 within such a selective epitaxial Si growth region. Since, however, this portion finally serves as an inactive emitter region of a transistor as will be described below, the normal operation of the transistor shows no problem (see FIG. 1-f).

Thereafter, a RTA process at 950° C. for about 30 seconds is executed to diffuse respective impurities.

According to a basic theory based on this diffusion, a flow J of each dopant complies with the following equation:

$$J = -D \times \partial N/\partial X$$

where D indicates a diffusion coefficient, N indicates an impurity concentration, and X indicates a position. Thus, the amount of flow of each impurity J is proportional to a diffusion coefficient and a concentration gradient of the impurity.

A diffusion coefficient $D_P$ of phosphor P corresponding to an N type dopant and a diffusion coefficient $D_B$ of boron B have a relationship of $D_P > D_B$. Even with respect to peak concentrations of both sides of the monocrystal silicon layer 107 shown in FIG. 1-f, phosphor P is higher than boron B by one digit. Thus, the diffusion of phosphor P from the island-shaped region 100C to the monocrystal silicon layer 107 increases as compared with the diffusion of boron B from the side-wall diffusion layer 106 to the monocrystal silicon layer 107. Consequently, the position of a PN junction is formed inside the right island shaped region 100DR as shown in FIG. 1-g.

The result of simulation will now be explained below.

FIG. 12 is a diagram showing an impurity diffused state of a semiconductor device of the present invention and diagram illustrating changes in dopant concentration for every dopants with respect to linear distances or dimensions (diffusion distances or lengths).

In FIG. 12, a phosphor P characteristic curve is a high-concentration characteristic and represents changes in dopant concentration with respect to diffusion distances (linear distances). The phosphor P characteristic curve indicates that phosphor is diffused approximately 0.27 μm at a linear distance during a change of from the maximum concentration $1E21/cm^3$ to a concentration $1E14/cm^3$ at a point near a point B where the curve is bent at substantially right angles. On the other hand, a boron B characteristic curve is a high-concentration characteristic and represents changes in dopant concentration with respect to diffusion distances (linear distances). The boron B characteristic curve indicates that boron B is diffused about 0.14 μm at a linear distance during a change of from the maximum concentration $8E18/cm^3$ to a concentration $1E11/cm^3$, and boron B is formed at an approximately 0.2 μm even a diffused depth formed during a period in which the same concentration $1E11/cm^3$ is kept.

It is understood from FIG. 12 that the linear distance of phosphor P at a high concentration, which moves until the dopant concentration is changed to a predetermined width, is considerably longer than that of boron B at a high concentration, i.e., phosphor P is greater than boron B in diffusion rate or speed. Further, the diffusion speed of phosphor P is estimated to be about approximately twice that of the boron B. Incidentally, a net doping profile curve indicates. changes in dopant concentration of the whole. semiconductor device with respect to linear distances (diffusion distances). A point A on the present characteristic curve indicates a junction between an N type dopant region and a P type dopant region.

Referring back to FIG. 1-g, phosphor P contained in the island-shaped region 100C is diffused into the side-wall diffusion layer 106 of an N type silicon layer 103N from the selective epitaxial growth region, i.e., monocrystal silicon layer 107 according to its diffusion speed, whereas boron B contained in the side-wall diffusion layer 106 is diffused into the N type silicon layer 103N according to its diffusion speed and owing to a further emitter push effect.

The diffusion speeds and diffusion regions at this time are represented as a region-to-region relationship with an emitter region, a base region and a collector region being shown as E, B and, C in parts in FIG. 12.

Boron B contained in the side-wall diffusion layer 106 is diffused into the corresponding N type silicon layer 103N adjacent to the side-wall diffusion layer 106 along the boron B characteristic curve. Simultaneously, phosphor P contained in the emitter region 100C is diffused up to the side-wall diffusion layer 106 via a selective epitaxial region (Epi) comprised of the monocrystal silicon layer 107 along the phosphor P characteristic curve and diffused up to a boron B diffusion region containing the side-wall diffusion region 106 according to conditions.

Thus, the point A indicative of the junction between the N type dopant region and the P type dopant region on the net doping profile is formed in the base region going beyond the selective epitaxial region (Epi). This means that the width (as viewed in a direction to extend the collector region from the emitter region) of the base region becomes thin by a portion where the point A of the net doping profile has broken into the base region.

As a result, an intrinsic base layer having a final base width 80 nm and a peak concentration of about 5E18 atoms/$cm^3$ is formed in the N type silicon layer 103 by heat treatment. According to a series of these process steps, the portion where the island-shaped region 100A and the island-shaped region 100B are close to each other, is also buried by the monocrystal silicon layer 107 owing to the selective epitaxial growth, and the side-wall diffusion layer 106 is formed by diffusing boron B into the monocrystal silicon. Thus, a base electrode withdrawal portion extending from an intrinsic base region 106' used as a pn junction of the side-wall diffusion layer 106 is formed (see FIG. 1-g2). The width of the intrinsic base region 106' is determined according to the difference in diffusion speed between the impurities and appears as such a configuration that the thickness thereof extending in a direction from the emitter region 100C to the collector region 100DL is rendered thin.

Thereafter, an oxide film is produced over the whole by CVD (Chemical Vapor Deposition), and openings are defined in the oxide film. Further, contacts extending from the respective regions are formed via the openings, followed by execution of a wiring process step.

When $B_2H_6$ is carried into an Si surface heated to about 800° C. where an instantaneous vapor phase diffusion method is adopted as one vapor phase diffusion method, $B_2H_6$ is decomposed into B and $H_2$, and this boron B is deposited on the Si substrate. Simultaneously with the formation of such a deposited layer, boron B is diffused into the Si substrate. The concentration of boron B to be diffused therein can be controlled by the flow rate of $B_2H_6$ used as a diffusion source and the time required therefor, and its subsequent heat-treatment condition.

As the vapor phase diffusion methods, may be mentioned, a method using an excimer laser, a plasma doping method, CVD, a method using MBE, etc. as an alternative to the above. They are applicable in a manner similar to the above.

Advantageous Effects of First Embodiment

In the first embodiment, the transistor can be implemented in which the final base width is about 80 nm and the peak concentration is about 5E18 atoms/cm$^3$. As a result, a transistor can be realized which has such performance that the maximum cutoff frequency fTmax is 40 GHz or higher.

In the prior SOI horizontal or lateral bipolar transistor, the base diffusion has been carried out by executing the opening-width control of the resist pattern and the ion-implantation method. On the other hand, in the present embodiment, the base diffusion can be effectively carried out by executing the ion diffusion in the hydrogen atmosphere containing $B_2H_6$, in other words, executing the vapor phase diffusion of the silicon wafer in the gas.

The base width can be formed shallow as compared with the pattern control employed in the conventional exposure technology and narrow based on thermal diffusion capable of performing high-accuracy control, without using the pattern control.

Since the ion-implantation method is not used, it is not necessary to bring the expansion of the base width due to horizontal or lateral channeling into question.

As a result, the base width, which holds a carrier's base running time under control, can be controlled to the latest vertical or lengthwise transistor level in addition to the low junction-capacitance characteristic that the SOI lateral bipolar transistor originally shares.

Worthy of special note is further that a transistor (N$^+$ type Si, N type Si, P type Si and resistance type are allowable) can be fabricated up by only triple exposure process steps, and a manufacturing period can be greatly shortened.

Second Embodiment

FIGS. 2-a through 2-c are process diagrams of a second embodiment of the present invention and show plan views thereof.

The second embodiment is an improved example of the first embodiment. After a process step equivalent to FIG. 1-g2 of the first embodiment has been completed (shown in FIG. 2-a), an N$^+$ collector region 123, a selective epitaxial growth region 108 provided therearound, and such a resist pattern 201 that some of both base regions 121 are defined as openings within a mask allowable range, are mainly formed as shown in FIG. 2-b (see FIG. 2-b). In the resist pattern 201, its etching range can be defined by linear sides thereof as shown in FIG. 2-b.

Thereafter, the whole portion is etched by a thickness of about 200 nm by isotropic dry etching to thereby remove the selective epitaxial growth region 108 and non-masked regions 152 (corresponding to a P$^+$ side-wall diffusion layer in an N type silicon layer 103N and a P$^+$-diffused selective epitaxial growth region of a base region) with boron B being diffused therein (see FIG. 2-c).

After the resist removal, process steps similar to the first embodiment are executed.

Advantageous Effects of Second Embodiment

In the first embodiment, the ends of the regions 152 having the diffused boron B and the N$^+$ collector region 123 are brought into contact with one another so that a reduction in collector-base junction withstand voltage is produced on a pinpoint basis. Since this portion is of an inactive portion, the collector-base junction withstand voltage can be improved by adding an exposure process step and removing it by using it. Since, however, a speed-performance improvement under a condition based on a bias not greater than a withstand voltage is based on a capacitance improvement in pinpoint junction, it is slight in degree.

Third Embodiment

FIGS. 3-a through 3-e are process diagrams of a third embodiment of the present invention and show cross-sectional views represented by cutting a semiconductor device in a lamination direction.

A structure comprised of a substrate wafer 301, a buried oxide film 302, a silicon layer 303, a thermal oxide film 304 and a silicon nitride film 305 sequentially laminated on one another is the same as one shown in FIG. 1-b of the first embodiment (see FIG. 3-a).

Next, a polycrystal silicon layer 306 is produced over the whole surface with a thickness of 200 nm, and resist patterns (not shown) similar to the first embodiment are formed according to a first exposure process step. A space defined between respective adjacent island-shaped regions is set as 200 nm.

Afterwards, only the polycrystal silicon layer 306 is vertically etched by anisotropic etching to thereby expose the silicon nitride film 305. Thereafter, a CVD oxide film (not shown) is produced over the entire surface with a thickness of 130 nm.

Thereafter, the CVD oxide film (not shown) is processed by anisotropic etching to thereby leave it behind in the form of sidewalls (307a through 307d). At this time, an opening width ranging from about 50 nm to about 70 nm is obtained by a self-alignment reduction with respect to a mask size ranging from 150 nm to 200 nm (see FIG. 3-b).

Next, the silicon nitride film 305, thermal oxide film 304 (see FIG. 3-c), silicon layer 303 and polycrystal layers 306 are etched with the remaining polycrystal silicon layers 306 and the sidewalls 307a through 307d each comprised of the CVD oxide film as masks to thereby expose the buried oxide film 302 (see FIG. 3-d).

A resist (not shown) is provided over the whole surface, and patterns (not shown) provided with openings corresponding to the sidewalls 307a through 307d each comprised of the CVD oxide film are formed by an exposure process step. Further, the sidewalls 307a through 307d are removed by etching, followed by removal of the resist masks.

A structure equivalent to FIG. 1-c in the first embodiment can be produced according to the above-described process steps (see FIG. 3-e).

While, however, the gap between the respective adjacent remaining island-shaped regions was 100 nm in the first embodiment, the gap could be narrowed up to 70 nm by using the self-alignment scale-down technology in the third embodiment.

Manufacturing process steps subsequent to FIG. 3-e are basically identical to those subsequent to the process step 1-e in the first embodiment. Since, however, the gap between the respective adjacent island-shaped regions is narrow, a selective epitaxial growth thickness for charging the gap between the respective adjacent island-shaped regions can be thinned to 35 nm at a minimum. It is also possible to restrain a condition for diffusing phosphor P from an emitter region. A distance Xj from the end of the emitter region 308 shown in FIG. 3-*e* may preferably be 70 nm at a minimum.

Since no PN junction is formed at a portion ② in FIG. 3-*e* although this portion is a crystal defect region, no problem arises in terms of characteristics.

Advantageous Effects of Third Embodiment

In the third embodiment, a junction depth of an emitter can be rendered shallow by the self-alignment reduction technology even if an exposure technology is used in which a restriction (design rule) is imposed on an opening width. While the selective epitaxial growth technology is used for the coupling between the respective separated island-shaped regions as illustrated in the embodiments described up to now, many defects occur in the interface with the buried oxide film 302 in each island-shaped region on a crystal basis, and if an emitter-base junction is formed in the buried oxide film 302 in each region, then a recombination current, i.e., a base current increases to thereby degrade transistor performance.

In order to avoid it, the embodiments illustrated up to now need to diffuse phosphor P corresponding to an impurity for determining conductivity type of the emitter region 308 deeper than the selective growth portion.

However, such diffusion needs equivalent heat-treatment. Consequently, a base's boron B distribution will also cause a re-distribution and the transistor performance cannot be improved.

In order to avoid these, it is effective to shorten the distance between the respective adjacent island-shaped regions and make thinner the thickness of the selective epitaxial growth film.

While, however, a narrower micro exposure technology is needed to simply realize it, an exposure technology of 100 nm or less encounters difficulties under the present situation or the cost becomes extremely high.

The third embodiment is capable of solving this dilemma. Even in the case of a design rule at about 200 nm, for example, 70 nm-micro fabrication can be realized and a emitter junction can be rendered shallow, thereby making it possible to make a contribution to an improvement in performance of a transistor. Further, since an emitter-base junction position can be formed at a position having a margin from a selective growth interface, a contribution to characteristic stabilization can be also achieved.

Fourth Embodiment

FIGS. 4-*a* through 4-*c* are process diagrams of a fourth embodiment of the present invention and show plan views thereof.

The present embodiment shows a manufacturing method of forming NPN and PNP on the same substrate.

A wafer (not shown) having a silicon layer containing phosphor P of about 5E16 atoms/cm$^3$ is used in the fourth embodiment. In a region (not shown: corresponding to a region made up of island-shaped regions 400A2, 400B2, 400C2 and 400D2 on the right side in FIG. 4-*a*) for forming a PNP transistor, however, a resist (not shown) is provided over the whole surface, and a pattern (not shown) corresponding to the region for forming the PNP transistor is formed by photolithography. Boron B is ion-implanted therein and anneal is done after the removal of the resist to thereby form P type regions (not shown: corresponding to regions respectively made up of the island-shaped regions 400C2 and 400D2 in FIG. 4-*a*) (a first exposure process step is included) in which boron B of about 1E17 atoms/cm$^3$ has been diffused.

As process steps prior to FIG. 4-*a*, process steps identical to the manufacturing process steps from FIG. 1-*a* to FIG. 1-*c* in the first embodiment are effected on the substrate wafer (a second exposure process step is included).

As a result, respective island-shaped regions 400A1, 400B1, 400C1 and 400D1 for an NPN transistor and the respective island-shaped regions 400A2, 400B2, 400C2 and 400D2 for the PNP transistor are formed.

A selective doping process step based on the following resist pattern (not shown) is effected on the different island-shaped regions for the NPN transistor and PNP transistor.

Namely, a resist is formed over the whole surface, and resist pattern openings (not shown) are provided in association with collector electrode portions (each corresponding to a P$^+$ type region 133 defined by lines or line segments in the island-shaped region 400D2 as viewed on the right side from a line or line segment formed by connecting the right sides of the island-shaped regions 400A2 and 400B2) for the island-shaped region 400A1, island-shaped region 400B1, island-shaped region 400C2 and island-shaped region 400D2 shown in FIG. 4-*a* according to a third exposure process step. After the formation of resist patterns (not shown), boron B$^+$ is ion-implanted under a dose condition of 5E16 ions/cm$^3$ at 50 keV to form high-concentration P$^+$ type regions 133.

A resist opening on the island-shaped region 400D2 is provided at a position spaced 0.4 μm or more from the corresponding side thereof adjacent to the island-shaped region 400C2.

(While it will be described in detail in the subsequent process step specifically, the surface of an N type region 132 of the island-shaped region 400D1 is doped with boron B$^+$ under the same condition to form a high-concentration doping region 401 of P type B$_2$H$_6$ simultaneously with this process step or as a subsequent process step. Thereafter, the resist is removed)

Next, a resist (not shown) is formed over the whole surface. A resist pattern opening (not shown) is formed in association with a collector region (corresponding to an N$^+$ type region 131 defined by lines or line segments in the island-shaped region 400D1 as viewed on the left side from a line or line segment formed by connecting the left sides of the island-shaped regions 400A1 and 400B1) for each of the island-shaped region 400A2, island-shaped region 400B2, island-shaped region 400C1 and island-shaped region 400D1 according to a fourth exposure process step. The resist opening on the island-shaped region 400D1 is provided at a position spaced 0.5 μm or more from the side thereof close to the island-shaped region 400C1. After the formation of resist patterns, phosphor P$^+$ is ion-implanted under 5E16 ions/cm$^3$ at 80 keV with these resist patterns as masks to thereby form N$^+$ type regions 131.

(while it will be described in detail in the subsequent process step specifically, the surface of a P type region 134 of the island-shaped region 400D2 is doped with phosphor P$^+$ under the same condition to form a high-concentration doping region 402 of N type PH$_3$. Thereafter, the resist is removed).

Next, ion-implanted regions (island-shaped regions 400A1, 400A2, 400B1, 400B2, 400C1, 400C2, 400D1, 400D2, doping region 401 and doping region 402) are activated by furnace anneal (heat treatment at 850° C. for 30 minutes in a nitrogen atmosphere, and a RTA process at 950° C. for 10 seconds following the furnace anneal. Afterwards, a thin-film thermal oxide film having a thickness of about 5 nm is produced at a silicon exposed portion by RTO (rapid thermal oxidation) at 850° C.

Next, a PNP transistor section (island-shaped regions 400A2, 400B2, 400C2 and 400D2) is protected with a resist (not shown) in a fifth exposure process step. Thereafter, each of resist patterns (not shown) is formed and a thin-film thermal oxide film (not shown) for each NPN transistor side wall existing in its opening is removed by diluted HF, followed by removal of the resist.

Afterwards, 5-minute heat treatment is done in a pressure-reduced hydrogen atmosphere containing $B_2H_6$ of 100 ppb at 800° C., and 10-minute heat treatment is continuously done in a hydrogen atmosphere not containing $B_2H_6$ to thereby dope the surface of the N type region 132 comprised of silicon with boron B. At this time, only the surface of the N type layer is reversed to a P type (see FIG. 4-*b*).

As a result, each of the high-concentration $P^+$ type regions 133 simply increases slightly in surface concentration of its exposed portion. No change occurs in conductivity type and the surfaces of the high-concentration $N^+$ type regions 131 are not brought into doping for a conductivity-type-changed level. The peak concentration of boron B at the surface of the N type layer is about $5E19/cm^3$, and the depth of its junction reaches about 0.1 μm. Since the surface of the PNP transistor is protected with an insulating film inclusive of even the thin thermal oxide film, doping of boron B does not occur.

Next, a thin-film thermal oxide film having a thickness of about 5 nm is produced on the exposed surface of silicon by RTO at 850° C.

Next, a resist (not shown) is formed to protect a NPN transistor section (island-shaped regions 400A1, 400B1, 400C1 and 400D1) in a sixth exposure process step. Thereafter, each of resist patterns (not shown) is formed and a thin-film thermal oxide film for each PNP transistor side wall existing in its opening is removed by diluted HF, followed by removal of the resist.

Afterwards, a few-minutes heat treatment is done in a hydrogen atmosphere containing $PH_3$ of 100 ppm at 800° C., and 10-minute heat treatment is continuously done in a hydrogen atmosphere not containing $PH_3$ to thereby dope the surface of the exposed silicon layer with phosphor P. At this time, only the surface of the P type region 134 is reversed to an N type (see FIG. 4-*c*).

Each of the high-concentration $N^+$ type regions 131 simply increases slightly in surface concentration of its exposed portion. No change occurs in conductivity type and the surfaces of the high-concentration $P^+$ type regions 133 are not brought into doping for a conductivity-type-changed level. The peak concentration of phosphor P at the surface of the P type region 134 is about $5E19/cm^3$, and the depth of its junction reaches about 0.1 μm. Since the surface of the NPN transistor is protected with an insulating film inclusive of even the thin thermal oxide film, doping of phosphor P does not occur.

Thereafter, the thin-film thermal oxide film on the above surface is removed by diluted HF.

Subsequent process steps are executed in a manner similar to the first embodiment, and all of the insulating films on the sidewalls of the monocrystal semiconductor layer are removed. Thereafter, the island-shaped regions, which serve as collector and base electrodes close to the main island-shaped regions, are electrically connected to one another by the selective epitaxial growth, and thereafter dopant thermal diffusion is carried out to form a thin base electrode, followed by formation of electrodes.

According to these process steps, the PNP transistor can be also formed on the same silicon substrate as well as the high-performance NPN transistor.

Advantageous Effects of Fourth Embodiment

Since the high-performance NPN transistor and PNP transistor can be formed on the same silicon substrate in the fourth embodiment, such a circuit form that the degree of freedom of basic circuit design is significantly improved, and merits such as a power consumption reduction are brought out to the fullest extent, can be also applied. Further, the exposure process steps result in six times in total. This means that the number of exposure process steps is substantially reduced once as compared with case in which PNP and NPN are independently formed on the same wafer. However, the exposure process step for separating the respective island-shaped regions requiring ultrafine patterns, and the exposure process step for forming the $N^+$ regions and $P^+$ regions, i.e., critical exposure process steps are shared. Although rough exposure process steps increase, a process-step load is substantially reduced in total. There is a merit in that since the selective epitaxial growth process step and most heat-treatment process steps can be shared, manufacturing loads in all the process steps can be significantly reduced as compared with the case of the above independent formation.

Fifth Embodiment

FIGS. 5-*a* and 5-*b* are process diagrams of a fifth embodiment of the present invention, and show surface diagrams thereof.

While a basic manufacturing method according to the fifth embodiment is identical to the first through fourth embodiments, their different points are as follows:

A first point resides in that a silicon layer of an SOI wafer to be used is limited to a crystal plane <111> substrate.

A second point resides in that a high-concentration P type diffusion region 502 in an N type region 132 is formed according to a selective epitaxial growth process step, an $N^+$ type region 131 and the N type region 132 for forming respective island-shaped regions are linked to each other by a formed epitaxial growth layer 501 (see FIG. 5-*a*), and thereafter, the selective epitaxial growth layers 501 exposed at side-wall portions of the connected island-shaped regions and a diffusion region formed in a gas are removed with a solution of potassium hydroxide at about 60° C. (see FIG. 5-*b*).

Since, at this time, the portion linked to the $N^+$ type region 131 and the N type region 132 for forming the island-shaped regions on both sides by the selective growth closely contacts the $N^+$ type region 131 and N type region 132 used as the island-shaped regions on both sides, no exposed portions exist in its sidewall and an exposed surface exists in its top surface portion alone. Since, however, this surface is a crystal plane <111>, an etching rate in an etching solution is significantly slow as compared with a crystal plane <110> of each sidewall portion, and the like. Therefore, etching of the top surface portion is hardly advanced.

Advantageous Effects of Fifth Embodiment

The selectively epitaxially-grown region and the oxide-film interface close thereto are hard to be obtained as ones high in crystallinity. Thus, if only the selective growth region 501 placed in the peripheral portion is removed as in the fifth embodiment, then a junction of both the selective epitaxial growth layer 501 serving as an N+ type collector region that reduces a CB withstand-voltage characteristic, and a P type base region 121 can be eliminated although it is on a pinpoint basis.

Sixth Embodiment

FIGS. 6-a and 6-b are process diagrams of a sixth embodiment of the present invention and show plan views thereof.

The sixth embodiment is substantially identical to the fifth embodiment in terms of its object and process flow.

Different points are as follows:

After the completion of selective epitaxial growth (see FIG. 6-a), hydrogen and an HCl gas are supplied within a process chamber at 800° C. A sidewall silicon portion 601 is etched in a manner similar to the fifth embodiment (see FIG. 6-b). Anisotropy of a crystal plane is obtained as to etching of a silicon crystal although it is not so much as in a potassium hydroxide solution.

An etching rate of a crystal plane <100> is of the fastest and an etching rate of a crystal plane <111> is of the slowest. However, a selection ratio is about 1/10 as compared with one in the potassium hydroxide solution.

Advantageous Effects of Sixth Embodiment

While the sixth embodiment brings about effects similar to the fifth embodiment, an increase in process step does not occur as the greatest merit. Thus, the amount of $HCl/H_2$ vapor-phase etching can be reduced and the etching amount of a crystal plane <111> at an upper surface portion of a linked portion can be held on to the minimum.

Seventh Embodiment

FIGS. 7-a through 7-c are process diagrams of a seventh embodiment of the present invention, and show cross-sectional views obtained by cutting a semiconductor device in a lamination direction.

The seventh embodiment is an embodiment in which a selective epitaxial growth condition is changed in the embodiment about the NPN transistor described up to now. The selective epitaxial growth condition described up to now was a selective epitaxial growth condition of Si under 15 Torr at 800° C. At this time, a process condition is taken wherein a hydrogen gas is 20SLM, $SiH_2Cl_2$ is 100 sccm and HCl=50 sccm, and a growth rate is about 20 nm/min.

The process steps from FIG. 1-a to FIG. 1-d illustrated in the first embodiment are executed. The process step shown in FIG. 1-d of the first embodiment is illustrated in FIG. 7-a.

In FIG. 7-a, an impurity is ion-implanted in a silicon layer for each island-shape region to thereby form a high-concentration N+ type region 131 and N type region 132 and an unillustrated high-concentration P type layer.

Next, the process step of FIG. 1-e illustrated in the first embodiment is executed to form a P-type doped ($10^{15}18$ $10^-/cm^3$) region 106" in its corresponding side face of the N type region 132 as shown in FIG. 7-b (see FIG. 7-b).

Next, a growth temperature is lowered to 700° C. and HCl=10 sccm and $SiH_2Cl_2$=100 sccm with respect to the hydrogen gas 20SLM. Further, a $CH_3SiH_3$ gas is contained in an atmosphere in a range of from a few 10 ppm~a few 100 ppm. According to this manufacturing process, a selective epitaxial growth layer 701 of non-doped Si—C is formed. Thus, C (carbon) is contained in a range of about 1E19 atoms/cm³ to 5E20 atoms/cm³ during selective epitaxial growth. Incidentally, a variation in growth rate due to the introduction of the $CH_3SiH_3$ gas is extremely small (see FIG. 7-c).

Thereafter, referring back to the process illustrated in the first embodiment, the thermal diffusion process step of FIG. 1-g is executed to thereby form a thin intrinsic base region, followed by formation of electrodes.

Advantageous Effects of Seventh Embodiment

A diffusion mechanism of boron B is dominant in diffusion via each Vacancy. It is known that when carbon C is added to each lattice position in an epitaxial growth layer, diffusion is suppressed. It is also known that if C is contained in the range of from about 1E19 atoms/cm³~5E20 atoms/cm³ during the selective epitaxial growth, then the addition of the concentration illustrated in the embodiment is effective. Thus, C suppresses the diffusion of boron B diffused from during vapor phase illustrated in each embodiment described up to now into the emitter side.

By adding C during the vapor phase of boron B, a redistribution of a boron B profile under the same heat treatment is suppressed, and the final performance of a transistor can be further improved.

Eighth Embodiment

FIGS. 8-a through 8-c are process diagrams of an eighth embodiment of the present invention and show cross-sectional views obtained by cutting a semiconductor device in a lamination direction.

The process steps from FIG. 1-a to FIG. 1-d illustrated in the first embodiment are executed. The process step shown in FIG. 1-d of the first embodiment is illustrated in FIG. 8-a.

In FIG. 8-a, an impurity is ion-implanted in a silicon layer for each island-shape region to thereby form a high-concentration N+ type region 131 and N type region 132 and an unillustrated high-concentration P type layer.

Next, the process step of FIG. 1-e illustrated in the first embodiment is executed to form a P-type doped ($10^{15}$~$10^{18}$/cm³) region 106" in its corresponding side face of the N type region 132 as shown in FIG. 8-b (see FIG. 8-b).

In the eighth embodiment, the selective epitaxial growth conditions employed in the seventh embodiment are used, whereby temperature is further lowered to about 640° C., and 10% hydrogen diluted $GeH_4$ is mixed about 35 ccm during growth, whereby germanium Ge is contained in a germanium to silicon Si ratio ranging from 5% to 40%. Due to the above reduction in temperature, carbon C enters into each Vacancy position in a ratio near approximately 100%. By adding $GeH_4$, a growth rate of about 6 nm/mm is obtained even at this temperature. As a result, a non-doped SiGe:C selective epitaxial growth layer 801 is formed (see FIG. 8-c).

Referring back to the process of the first embodiment subsequently, the thermal diffusion process step of FIG. 1-g is executed to form a thin intrinsic base region, followed by formation of electrodes.

Advantageous Effects of Eighth Embodiment

In the eighth embodiment, C hardly enters into each inactive interstitial position due to the temperature reduction but enters into each Vacancy position. Since $GeH_4$ is added, the growth rate also results in a little less than ten times the growth rate in the seventh embodiment, thus making it possible to shorten a growth time.

Ninth Embodiment

FIGS. 9-a and 9-b are process diagrams of a ninth embodiment of the present invention and show plan views thereof.

FIG. 9-b illustrates the ninth embodiment of the present invention. The first embodiment is shown in FIG. 9-a to explain the difference between the ninth embodiment and the first embodiment.

In the ninth embodiment, a manufacturing method may be any of the methods illustrated in the first through eighth embodiments. However, the ninth embodiment is characterized by plane patterns. Base regions 121 are disposed interchangeably with emitter regions 122 and in positions face-to-face with an island-shaped region used as a collector region 123 with an N type region 132 interposed therebetween. However, an interval or space between each of island-shaped regions of the base regions 121 and each of island-shaped regions of the emitter regions 122 is placed in a position (non short-circuited position) spaced away from the island-shaped region of the collector region 123. After selective epitaxial growth, the island-shaped regions of the emitter regions 122 and the island-shaped regions of the base regions 121 are disposed so as not to connect to one another.

Advantageous Effects of Ninth Embodiment

The ninth embodiment allows a reduction in base resistance. Namely, while the base resistance increases in proportional to a plane base length, a plane emitter length can be divided in the ninth embodiment. Therefore, the base resistance can be reduced according to the number of divisions as compared with the case where the total emitter length is standardized. Such a structure is extremely effective for an input/output transistor that provides a flow of a large current. Such a transistor must normally increase an effective emitter area. If the planar structure employed in each embodiment described up to now is taken, then the emitter length becomes extremely long and correspondingly a sudden increase in base resistance is incurred.

If the transistors illustrated in the embodiments described up to now are simply arranged in parallel, then the large current is allowed to flow as a matter of course. However, the occupied rate of a total pattern area increases, thus exerting an influence on high integration.

Tenth Embodiment

FIGS. 10-a through 10-f are process diagrams of a tenth embodiment of the present invention, wherein FIGS. 10-a, 10-b, 10-c, 10-d, 10-e and 10-f are respectively cross-sectional views cut by line A–A' of FIG. 10-d corresponding to a plan view.

A prime wafer of SOI has a structure identical to the first embodiment and comprises a silicon substrate wafer 1001, a buried oxide film 1002 and a silicon layer 1003.

A thermal oxide film 1004 of 5 nm and an Si nitride film 1005 of 100 nm are successively produced on the wafer in a manner similar to the first embodiment. Afterwards, a square pattern is left behind by an exposure process step and an anisotropic etching process to expose the buried oxide film 1002 (see FIG. 10-a).

Next, each sidewall portion of the exposed silicon layer 1003 is thermally oxidized about 10 nm to thereby form a thermal oxide film 1006 (see FIG. 10-b). Thereafter, a polycrystal Si layer 1007 is produced over the whole surface by an LP (Low Pressure)-CVD method with a thickness of 500 nm, followed by polishing by CMP (Chemical Mechanical Polish) until the Si nitride film 1005 is exposed. Further, an EPD (End Point Detector) performs its endpoint detection, whereby a CMP process is completed.

Here, the Si nitride film 1005 may be thinned as compared with its initial thickness.

Thereafter, the polycrystal Si layer 1007 is etched up to a position slightly lower than the position of the bottom face of the remaining Si nitride film 1005 with the Si nitride film 1005 as a mask, followed by removal of the thermal oxide film 1006 with diluted HF (see FIG. 10-c).

Next, resist patterns 1008 are formed as shown in FIG. 10-d and 10-d2 by an exposure process step. At this time, the interval defined between the respective adjacent resist patterns is set as 200 nm.

Next, the polycrystal silicon layer 1007 other than the resist patterns 1008 is etched by polycrystal Si anisotropic etching high in selectivity with respect to the Si nitride film 1005 to thereby expose the buried oxide film 1002 (see FIGS. 10-d and 10-d2).

While the Si nitride film 1005 may be etched in terms of the characteristic of dry etching at this time, the total process setting should be carried out so that the thermal oxide film 1004 is not exposed. The resist patterns 1008 are removed (see FIG. 10-e).

Thereafter, a high-concentration N$^+$ region and a high-concentration P$^+$ region are formed according to two exposure process steps in a manner similar to the first embodiment. However, plane patterns are set as patterns similar to the ninth embodiment.

Afterwards, the diffusion of boron B in a vapor phase state thereof, and process steps such as a link of respective island-shaped regions by selective epitaxial growth, etc. are executed in a manner similar to the first embodiment. Since, however, the interval between a monocrystal Si region and a polycrystal Si region is about 10 nm, this degree of thickness will be enough for the thickness of a selective epitaxial growth film. As a result, an N$^+$ type emitter region 1010 and a P type base region 1009 are linked to a buried region between a high-concentration N$^+$ type emitter region and an N type collector region.

A sectional structure including the emitter region at the time that these process steps have been completed, is shown in FIG. 10-f.

As its subsequent process steps, the process steps subsequent to FIG. 1-d of the first embodiment are executed to perform dopant thermal diffusion, thereby forming a thin intrinsic base region, followed by formation of electrodes.

Advantageous Effects of Tenth Embodiment

In the tenth embodiment, the base electrode and the emitter region are manufactured by the polycrystal silicon as an alternative to the monocrystal Si employed in the embodiments described up to now. Thus, electrode components of an emitter resistance and a base resistance are significantly reduced. Since a diffusion coefficient of an impurity in each polycrystal region is greatly larger than that for the monocrystal silicon, the concentration level of the impurity becomes uniform promptly even in the case of relatively low-temperature heat treatment.

Since the interval between the monocrystal silicon region and the polycrystal silicon region can be controlled by the thickness of the thermal oxide film, this thickness can be narrowed up to about 10 nm. Therefore, this degree of growth thickness will be enough for the selective epitaxial growth for allowing the polycrystal silicon region and the monocrystal silicon region to be linked to each other. This makes it possible to make an emitter junction extremely shallow as well as to suppress a load on the epitaxial growth. In the case of this embodiment, it can be set to about 20 nm to about 30 nm.

In a transistor manufactured by the manufacturing method according to the embodiment, materials and a profile structure from the emitter region thereof to the collector region thereof can be brought to structures exactly equivalent to a high-performance vertical type transistor.

Eleventh Embodiment

FIGS. 11-a through 11-c are process diagrams of an eleventh embodiment of the present invention.

A basic manufacturing method is similar to the tenth embodiment. A substrate wafer 1101, a buried oxide film 1102 and a silicon layer 1103 are identical to those employed in the first embodiment. The surface is thermally oxidized about 5 nm to form a thermal oxide film 1104 of TH—SiO$_2$. Thereafter, an Si nitride film 1105 of Si$_3$N$_4$ is produced over the whole surface with a thickness of 200 m. Further, a region excluding a square island-shaped region is removed by exposure technology/anisotropic etching to thereby expose the buried oxide film 1102. Next, a TEOS (Tetra Oxide Siran) film 1106 corresponding to a CVD oxide film is produced over the entire surface with a thickness of about 10 nm by an LP-CVD method and thereafter a polycrystal Si layer 1107 is produced over the whole surface with a thickness of about 500 nm, followed by exposing of the Si nitride film 1105 by CMP. When the TEOS film 1106 on the Si nitride film 1105 remains here, it can be removed by diluted HF processing in the next process step.

Next, the TEOS film 1106 interposed between the silicon layer 1103 and the polycrystal silicon layer 1107 is removed by diluted HF (see FIG. 11-b).

Thereafter, the polycrystal Si exposure/etching process step is completed and plane patterning is finished in a manner similar to the ninth and tenth embodiments. Process steps subsequent to it are executed in a manner similar to the tenth embodiment. As a result, an N$^+$ type emitter region 1109 and a P type base region 1108 are connected or linked with a buried region between an N$^+$ type emitter region 122 and an N type collector region 124 (see FIG. 11-c).

As its subsequent process steps, the process steps subsequent to FIG. 1-d of the first embodiment are executed to perform dopant thermal diffusion, thereby forming a thin intrinsic base region, followed by formation of electrodes.

Advantageous Effects of Eleventh Embodiment

The thermal oxide film is removed by executing the diluted HF processing in the tenth embodiment, whereas the TEOS film corresponding to the CVD oxide film is removed in the eleventh embodiment. Although the TEOS film depends even on a growth condition, an etching rate for HF is as fast as about ten times of that for the thermal oxide film. Therefore, it means that a selection ratio for etching is about ten times with respect to the thin thermal oxide film 1104 interposed between the silicon layer 1103 and the Si nitride film layer 1105. The amount of side etch can be greatly restrained.

Other Embodiment

As described in the respective embodiments above, a semiconductor device of the present invention has a configuration wherein in a lateral bipolar transistor having an SOI structure, a selective epitaxial growth region is provided in an emitter region near an active region. The semiconductor device is provided with a base region into which an impurity in the emitter region is diffused thin via the selective epitaxial growth region, and the emitter region. The width of the base region is set to less than or equal to 100 nm.

A transistor can be realized in which as to the base width as described in the section of the effects of the first embodiment, the final base width is about 60 nm, and the peak concentration is about 5E18 atoms/cm$^3$. This result shows that the performance of a transistor whose maximum cutoff frequency fTmax is 40 GHz or higher, is realized.

Further, the base width can be read from an impurity diffused state of the semiconductor device of the present invention.

The relationship between the linear distances to the impurity layers and their corresponding impurity concentrations as viewed with the epitaxial growth layer as the center on the basis of FIG. 12 is shown in Table 1.

| Linear distance | Impurity concentration (10$^n$/cm$^3$) | | |
|---|---|---|---|
| | Boron | Phosphor | Net Doping |
| −0.20 | 0 | 21.1 | 20.3 |
| −0.15 | 0 | 2.1 | 20.8 |
| −0.10 | 0 | 20.3 | 20.2 |
| −0.05 | 16.6 | 2.0 | 19.8 |
| 0.00 | 18.5 | 1.9 | 18.5 |
| 0.05 | 18.1 | 16.3 | 18.1 |
| 0.10 | 14.4 | 13.8 | 14.4 |
| 0.15 | 11.3 | 13.7 | 11.3 |

In FIG. 12, the difference between the value of a linear length or distance C at the point A at which the characteristics of all the impurities, i.e., net doping (Net Doping) profile changes, and a linear distance D at the point B where the characteristics of boron B and phosphor P intersect, results in 0.1 μm (100 nm).

From this aspect, a width less than or equal to 100 nm can be actually fabricated as the base width. As a preferable example, may be mentioned 60 nm.

Thus, a semiconductor device of the present invention has a base having a thin width, which can be formed only by a method of burying a space between respective adjacent island-shaped regions by a manufacturing method, mainly a selective epitaxial growth to thereby form a diffusion region, thinly diffusing an impurity of each island-shaped region into a base region via the diffusion region to thereby form the corresponding base region having an extremely thin width. Therefore, the semiconductor device can be provided with a base width impossible of attainment in the prior art, and consequently a base resistance can be reduced.

The present invention brings about an advantageous effect in that since a diffusion region having a narrow width is formed using selective epitaxial growth means and a corresponding impurity is diffused into the diffusion region by a predetermined diffusion process, a base region having a narrow width can be selectively formed, thereby making it possible to reduce base prolongation, improve an operating speed, suitably cope with a high-frequency operation and reduce the number of manufacturing process steps.

According to a method of manufacturing a bipolar transistor of the present invention, island-shaped regions are electrically connected to one another by using selective epitaxial growth means and the width of a base diffusion region is formed narrow by the diffusion of an impurity. Therefore, it is possible to narrow even a base width impossible of attainment by the conventional photolithography.

Since a diffusion region for an emitter is formed by use of the selective epitaxial growth means, the concentration of each impurity to be distributed therein can be rendered uniform.

Thus, the concentration of the impurity in the emitter diffusion region becomes uniform, and a base resistance is reduced by the narrowed width of base diffusion region.

Further, since a shallow emitter diffusion region is formed in the base diffusion region joined to its corresponding emitter electrode by diffusion processing, the width of the base diffusion region can be narrowed.

A semiconductor device of the present invention takes a configuration wherein in a horizontal or lateral bipolar transistor having an SOI structure, an epitaxial growth region is provided in an emitter region near an active region, and an impurity is diffused into a base region adjacent thereto via the epitaxial growth region to thereby provide the corresponding thin base region. Thus, the maximum cutoff frequency (fTmax) increases.

Another aspect of the present invention, there is provided a semiconductor device, comprising an epitaxial growth region provided in an emitter region near an active region in a lateral bipolar transistor of an SOI structure, a base region in which an impurity of the emitter region is diffused thin via the epitaxial growth region, and the emitter region. Here, a base width is set to less than or equal to 100 nm.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of forming a semiconductor device, comprising:
    forming first and second semiconductor layers of first conductivity type each disposed in a transistor forming region and spaced apart from each other a predetermined distance by a spaced region, and forming the first semiconductor layer so as to have a concentration higher than the second semiconductor layer;
    vapor-phase diffusing an impurity of second conductivity type into side faces of the second semiconductor layer which are exposed in the spaced region;
    embedding a non-doped semiconductor layer between the first and second semiconductor layers in the spaced region; and
    performing heat treatment to change the non-doped semiconductor layer into the first conductivity type, to change a region of the vapor phase diffused side faces into the first conductivity type, and to change another region of the vapor phase diffused side faces into an intrinsic base region.

2. The method as claimed in claim 1, wherein during said forming first and second semiconductor layers, a third semiconductor layer of the first conductivity type that has higher concentration than the second semiconductor layer is formed in continuous connection with the second semiconductor layer,
    during said embedding, side faces of the third semiconductor layer are covered by the non-doped semiconductor layer, and
    during said performing heat treatment, a portion of an inactive region at a surface of the third semiconductor layer is changed to the first conductivity type,
    the method further comprising removing a region of the third semiconductor layer containing the portion chanced to the first conductivity type.

3. The method as claimed in claim 1, further comprising providing a substrate with a transistor forming region thereon including first transistor forming regions in which the first conductivity type is N type and the second conductivity type is P type, and second transistor forming regions in which the first conductivity type is P type and the second conductivity type is N type,
    wherein said forming first and second semiconductor layers, said vapor-phase diffusing, said embedding and said performing heat treatment are carried out on both the first and second transistor forming regions.

4. The method as claimed in claim 1, wherein a crystal plane of the non-doped semiconductor layer is limited to a <111> plane, a connection between the first semiconductor layer and the second semiconductor layer is completed by said embedding, and thereafter the non-doped semiconductor layer on each of sidewalls of the first and second semiconductor layers is removed using a potassium hydroxide solution.

5. The method as claimed in claim 1, wherein a crystal plane of the non-doped semiconductor layer is limited to a <111> plane, a connection between the first semiconductor layer and the second semiconductor layer is completed by said embedding, and thereafter the non-doped semiconductor layer on each of sidewalls of the first and second semiconductor layers is removed using a hydrogen gas containing HCl.

6. The method as claimed in claim 1, wherein a gas atmosphere during said embedding is set in which carbon C is contained in a range of from 1E19 atoms/cc to 5E20 atoms/cc.

7. The method as claimed in claim 1, wherein a gas atmosphere during said embedding is set in which carbon C is contained in a range of from 1E19 atoms/cc to 5E20 atoms/cc, and germanium Ge is contained in a germanium to silicon Si ratio ranging from 5% to 40%.

8. The method as claimed in claim 1, wherein the first semiconductor layer and the intrinsic base region are alternately provided in plural form so as to be spaced from the second semiconductor layer.

9. A method of forming a semiconductor device, comprising:
    preparing a substrate having an insulating layer formed on a surface thereof;
    forming first and second semiconductor layers of first conductivity type both disposed on the insulating layer and spaced apart from each other a predetermined distance by a spaced region, and forming the first semiconductor layer so as to have a concentration higher than the second semiconductor layer;
    vapor-phase diffusing an impurity of second conductivity type into side faces of the second semiconductor layer which are exposed in the spaced region;
    embedding a non-doped semiconductor layer between the first and second semiconductor layers in the spaced region; and performing heat treatment to change the non-doped semiconductor layer into the first conductivity type, to change a region of the vapor phase diffused side faces into the first conductivity type, and to change another region of the vapor phase diffused side faces into an intrinsic base region.

10. The method as claimed in claim 9, wherein during said forming first and second semiconductor layers, a third semiconductor layer of the first conductivity type that has higher concentration than the second semiconductor layer is formed in continuous connection with the second semiconductor layer, during said embedding, side faces of the third semiconductor layer are covered by the non-doped semiconductor layer, and during said performing heat treatment, a portion an inactive region at a surface of the third semiconductor layer is changed to the first conductivity type, the method further comprising removing a region of the third semiconductor layer containing the portion changed to the first conductivity type.

11. The method as claimed in claim 9, wherein the substrate is configured as an SOI structure, wherein a substrate wafer is formed with the insulating layer embedded thereon and the first semiconductor layers as monocrystal layers.

12. The method as claimed in claim 9, further comprising providing the substrate with a transistor forming region thereon including first transistor forming regions in which the first conductivity type is N type and the second conductivity type is P type, and second transistor forming regions in which the first conductivity type is P type and the second conductivity type is N type, wherein said forming first and second semiconductor layers, said vapor-phase diffusing, said embedding and said performing heat treatment are carried out on both the first and second transistor forming regions.

13. The method as claimed in claim 9, wherein a crystal plane of the non-doped semiconductor layer is limited to a <111> plane, a connection between the first semiconductor layer and the second semiconductor layer is completed by said embedding, and thereafter the non-doped semiconductor layer on each of sidewalls of the first and second semiconductor layers is removed using a potassium hydroxide solution.

14. The method as claimed in claim 9, wherein a crystal plane of the non-doped semiconductor layer is limited to a <111> plane, a connection between the first semiconductor layer and the second semiconductor layer is completed by said embedding, and thereafter the non-doped semiconductor layer on each of sidewalls of the first and second semiconductor layers is removed using a hydrogen gas containing HCl.

15. The method as claimed in claim 9, wherein a gas atmosphere during said embedding is set in which carbon C is contained in a range of from 1E19 atoms/cc to 5E20 atoms/cc.

16. The method as claimed in claim 9, wherein a gas atmosphere during said embedding is set in which carbon C is contained in a range of from 1E19 atoms/cc to 5E20 atoms/cc, and germanium Ge is contained in a germanium to silicon Si ratio ranging from 5% to 40%.

17. The method as claimed in claim 9, wherein the first semiconductor layer and the intrinsic base region are alternately provided in plural form so as to be spaced from the second semiconductor layer.

* * * * *